United States Patent
Ayukawa et al.

(10) Patent No.: US 6,229,752 B1
(45) Date of Patent: May 8, 2001

(54) SEMICONDUCTOR INTEGRATED CIRCUIT DEVICE

(75) Inventors: Kazushige Ayukawa, Kokubunji; Takao Watanabe, Fuchu; Susumu Narita, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/367,544

(22) PCT Filed: Feb. 17, 1997

(86) PCT No.: PCT/JP97/00410

§ 371 Date: Aug. 16, 1999

§ 102(e) Date: Aug. 16, 1999

(87) PCT Pub. No.: WO98/36419

PCT Pub. Date: Aug. 20, 1998

(51) Int. Cl.[7] ........................................ G11C 8/00
(52) U.S. Cl. .................. 365/230.03; 365/230.01; 365/230.06
(58) Field of Search ................ 365/230.03, 239, 365/189.04, 230.09, 230.01, 230.06, 196

(56) References Cited

U.S. PATENT DOCUMENTS 5,737,746 * 4/1998 Hardin et al. ..................... 711/118
5,781,466 * 7/1998 Tanaka et al. ..................... 365/49
5,875,452 * 2/1999 Katayama et al. ................. 711/105
6,032,241 * 2/2000 Green ............................... 711/207

FOREIGN PATENT DOCUMENTS 8-301538   11/1996  (JP).

* cited by examiner

Primary Examiner—David Nelms
Assistant Examiner—Thong Le
(74) Attorney, Agent, or Firm—Mattingly, Stanger & Malur, P.C.

(57) ABSTRACT

A memory macro is a combination of functional modules such as a main amplifier module, memory bank modules of which each memory bank operates independently, a power source circuit, etc. The storage capacity of the memory macro can be easily changed from a large capacity to a small one by changing the number of the memory bank modules. A control circuit in the memory bank modules of the memory macro has an additional address comparing function. Therefore, the same page can be accessed at high speed without providing any control circuit outside the memory macro. In addition, a module having a function such as a memory access sequence control is provided and, when memory access is made, identification information is issued at the time of inputting/outputting address or data. Therefore, high-speed memory access can be realized by checking the coincidence between the data and address with the ID and controlling the memory access sequence so that the address inputting order and data outputting order can be changed.

22 Claims, 27 Drawing Sheets

SEMICONDUCTOR INTEGRATED CIRCUIT DEVICE

TECHNICAL FIELD

The present invention relates to a semiconductor integrated circuit device comprising highly integrated memories such as DRAM (Dynamic Random Access Memory) devices, and more particularly to an effective technique applicable to a fast accessing method for highly integrated memories.

BACKGROUND ART

In recent years, the high integration of LSI (Large Scaled Integrated Circuit) devices has come to be possible along with the progress of semiconductor manufacturing techniques. This has also made it possible to integrate both large capacity memories and large scaled logic circuits together on one semiconductor chip. With such a semiconductor chip, it is easy to increase the number of data I/O lines to thereby improve the data throughput between memory and logic circuit. This also makes it possible to reduce the power consumption of data I/O operations more and transfer data faster than in a case in which I/O pins provided outside the semiconductor chip are driven. The advantages of such a semiconductor chip are thus expected to be used more and more in the future.

There is a semiconductor chip in which a large capacity memory, a large scaled logic circuit, and a fast operation cache memory are combined. This semiconductor chip is intended to use a cache memory for reducing the difference of the operation speed between the large capacity memory and the large scaled logic circuit. Such a semiconductor chip is described, for example, in "an article by Toru Shimizu, et al., entitled "A Multimedia 32 b RISC Microprocessor with 16 Mb DRAM", 1966 IEEE International Solid-State Circuits Conference, Digest of Technical Papers pp. 216–217 (hereafter, to be referred to as the prior art technique 1)". According to this prior art technique 1, a 32-bit microprocessor, a 2 MB DRAM, and a 2 KB cache memory are connected to each other through a 128-bit wide internal bus. When 128-bit data is transferred, the operation is terminated in five cycles between the microprocessor and the DRAM and in one cycle between the microprocessor and the cache memory. Consequently, while the cache memory is hit, the number of data transfer cycles can be reduced to ⅕.

DISCLOSURE OF THE INVENTION

For a memory to be mounted on a semiconductor chip that is realized, for example, by the prior art technique 1, various functions such as the continuous reading function, cache function, access control function, etc., are indispensable. The capacity of the semiconductor chip must also be changed according to how the semiconductor chip is used. However, both large capacity memory and cache memory use many analog circuits in a portion that requires fast operation required portion respectively. When the function and capacity of a memory are to be changed, therefore, the design of the memory itself must be updated significantly even for a minor change.

Furthermore, in the case of a semiconductor chip realized, for example, by the prior art technique 1, it is very important to make the TAT (Turn Around Time) shorter between deciding on the specifications and completing of the product. In order to satisfy this requirement, therefore, the three requirements of enhanced functions, ease in changing capacity, and a shorter TAT must be achieved together.

Furthermore, when a cache memory is used for fast memory accesses on such a semiconductor chip, a problem arises as follows. While cache memory is hit, the fast memory access is assured. Once a miss occurs, however, the main memory is accessed, which takes more time. This causes the operation of the CPU (Central Processing Unit) to be limited dominantly.

Generally, a DRAM can be accessed fast comparatively if consecutive addresses are accessed in a single page of the DRAM. If a different page is accessed (a page miss occurs), however, the access becomes slow due to the pre-charging of the object, etc., which are indispensable in such a case. There is a method proposed for solving such a problem using a multi-bank structure, thereby hiding such a DRAM page miss. This method is disclosed in the previous application (Japanese Patent Application No. 08-301538 (filed on Nov. 13, 1996)) by some inventors of this application.

The method disclosed in the previous application described above, however, cannot avoid such a page miss when in random memory accesses.

Under such circumstances, it is an object of the present invention to make it easier to design a memory macro provided with various functions and a variable capacity, which is integrated in a large scaled logic circuit such as a microprocessor and an image processor.

It is another object of the present invention to provide a memory that can be interfaced easily with a large scaled logic circuit such as a microprocessor and an image processor.

It is further another object of the present invention to provide a memory that can reduce problems such as a page miss, etc.

These, other, and further objects, as well as new features of the present invention will be apparent from the description and accompanying drawings in this application.

Some, representative items of the present invention disclosed in this application will now be described briefly.

In order to compose a memory macro (MM) to be mounted in a semiconductor integrated circuit device (chip), a data base (1) is prepared. The data base (1) comprises such function blocks as memory bank modules (10, 11, and 12), a main amplifier module (13), a power supply module (14), a controller module (15), etc. Each function block prepared for the data base (1) is composed so as to allow power supply and signal lines to be connected automatically when the function block is just disposed adjacent to others. This will make it possible to easily design a memory macro provided with various functions and a variable capacity only by changing the types and number of function blocks for composing a large capacity memory and a cache memory respectively.

The controller (BKCONTH) in the memory bank module (11) is provided with an address comparing function (COMP), thereby composing the memory macro (MM3). This will make it possible to compose a memory macro that can be accessed fast without providing any controller outside the memory macro itself when accesses are made to a single page.

The memory macro (MM4) is composed of a plurality of memory bank modules (11) and a controller (17) for controlling the memory bank modules. The controller module (17) is composed so as to manage both address and data by adding an ID (identification) to both address and data so they correspond with each other. This will make it possible to change the address input order and the data output order, thereby outputting earlier-prepared data earlier even when the address is entered after the corresponding data if a page miss occurs, so that the memory access becomes faster.

BEST MODE FOR CARRYING OUT THE INVENTION (Configuration of a Memory Macro and How to Compose the Same)

Figure 1:
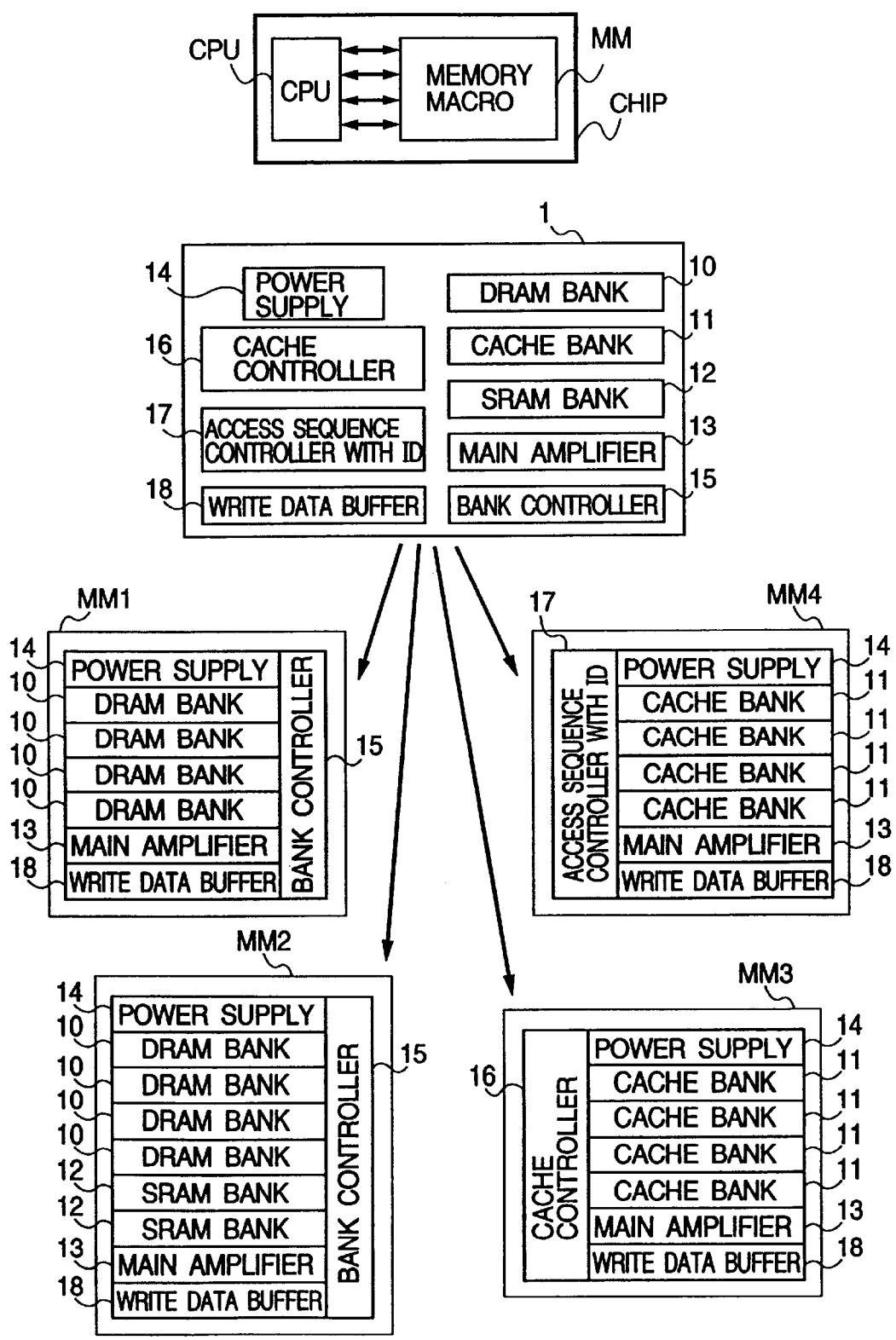
FIG. 1 is a configuration of a memory macro and how the memory macro is composed.

FIG. 1 shows a configuration of the memory macro of the present invention and how to compose the memory macro. A central processing unit CPU, which is an example of a large scaled logic circuit and a memory macro MM, which is an example of a large capacity memory, are integrated on a semiconductor integrated circuit device CHIP formed on a semiconductor substrate (on a chip). The semiconductor integrated circuit device CHIP is manufactured with, for example, the CMOS (Complementary Metal Oxide Semiconductor) processing technique and sealed in a plastic package with a resin molding technique, etc. According to the size and type of such a logic circuit to be integrated with the memory macro MM just like this chip, the capacity and speed required for the memory macro MM are varied largely, but the designing of the memory macro MM must be finished quickly.

A data base 1 for composing the memory macro MM is provided with function blocks (modules) realizing various functions. In other words, on the data base 1 are integrated a DRAM bank module 10 that uses DRAM (Dynamic Random Memory) memory cells consisting of one transistor and one capacitor respectively; a cache bank module 11 formed with the DRAM bank module 10 provided with a hit/miss judging function; an SRAM bank module 12 that uses SRAM (Static Random Access Memory) memory cells consisting of four or six transistors respectively; a main amplifier module 13 for exchanging data between a memory bank (DRAM bank 10, a cache bank 11, an SRAM bank, etc.) and a device provided outside the memory macro MM; a power supply circuit module 14 for supplying power to each of the modules composing the memory macro MM; a bank controller module 15; a cache controller module 16; an access sequence controller module with ID 17; a write data buffer module 18, etc.

Those function blocks are disposed side by side so that the necessary power supply and signal lines, as well as data input/output lines of those function blocks are connected automatically.

Memory macros MM varied in both capacity and function respectively can thus be composed quickly, since the data base 1 is prepared as described above.

In addition, there is no need to modify any memory access request devices nor design any new interface circuits, since the interface circuit used between memory and memory access request device is prepared in the object memory macro. The memories included in the memory macro are, for example, a bank controller module 15, a cache controller module 16, an ID attached access sequence controller module 17, a write data buffer module 18, etc.

In order to compose such a memory macro MM provided with predetermined functions, therefore, it is only necessary to select necessary function blocks from the data base 1 and just dispose those function blocks. Hereunder, each of the memory macros MM1, MM2, MM3, and MM4 shown in FIG. 1 will be described briefly.

(1) Memory Macro MM1

The memory macro MM1 comprises a DRAM bank module 10, a main amplifier module 13, a power supply circuit module 14, a bank controller module 15, and a write data buffer module 18 selected respectively from the data base 1. Those function blocks are designed so as to be wired automatically as needed when they are disposed side by side. If those function blocks are disposed as shown in FIG. 1, therefore, the memory macro MM1 that uses DRAM will be composed easily.

For example, the positions of the power supply lines of the DRAM bank module 10, the main amplifier module 13, the power supply circuit module 14 are all common to their function block, so that the power supply lines of those function blocks can be connected automatically when they are just disposed as predetermined as shown in FIG. 1.

The data input/output lines of those function blocks are also connected via a global bit line GBL (also referred to as a common bit line and a common data line) respectively disposed at a predetermined position for easier connection. Such line connections will be described below more in detail.

Since such the commonality in those wiring positions makes it easier to add and modify each of those function blocks, it is also easy to change, for example, the capacity of a memory. In FIG. 1, if the memory capacity of a DRAM bank module 10 used for the memory macro MM1 is 256K bits, the total capacity of the memory macro MM1 becomes 1M bits. If a memory macro of 2M bits in capacity is needed, therefore, the memory macro can be composed with 8 DRAM bank modules 10. If only a memory capacity of 512K bits is needed for an object memory macro, only two DRAM bank modules 10 are needed.

The memory macro MM1 comprises three types of modules (the DRAM bank module 10, the power supply module 14, and the main amplifier module 13) such way, so the configuration of the memory macro MM1 can be minimized, thereby its memory capacity is changed easily. Such the memory macro configuration will thus be suitable for a memory of a large capacity and a minimized area.

(2) Memory Macro MM2

The memory macro MM2 comprises a DRAM bank module 10, an SRAM bank module 12, a main amplifier module 13, a power supply circuit module 14, a bank controller module 15, and a write data buffer module 18 selected respectively from the data base 1.

Since the operation of the SRAM bank module 12 is fast, it is possible to compose a large capacity memory provided with a cache function using the SRAM bank module 12. Since the SRAM portion to be accessed fast comparatively and the DRAM portion to be accessed rather slowly are integrated in different address ranges, the SRAM portion is composed so as to function as a so-called cache, which is to be accessed fast. If the memory capacity is to be increased, it is only needed to increase the number of the DRAM bank modules 10. If the cache capacity is reduced, thereby reducing the necessary chip area, therefore, it is only needed to reduce the two SRAM bank modules 12 only to one. The memory macro MM2 is provided with such a cache function and the capacity of the cache can thus be changed easily.

(3) Memory Macro MM3

The memory macro MM3 is a memory macro provided with a cache function. The memory macro MM3 comprises a cache bank module 11, a main amplifier module 13, a power supply module 14, a cache controller module 16, and a write data buffer module 18 selected respectively from the data base 1.

The memory macro MM3 controls the cache bank module 11 using the cache controller module 16, thereby realizing the cache function. In other words, when data exist in the same word line (the same page), the data can be accessed faster.

Just like the DRAM bank module 10, the cache bank module 11 is a memory bank module using DRAM memory cells. The cache bank module 11 can thus be said to be a kind of a DRAM memory bank provided with a hit/miss judging circuit incorporated in its bank, and it uses a sense amplifier block SA as a cache memory. With this hit/miss judging circuit incorporated in its bank, the cache controller module 16 can be reduced in size. The cache bank module 11 will therefore be suitable especially for a small capacity memory macro for which a cache function is indispensable. When compared with the memory macro MM2 composed of the DRAM bank module 10 and the SRAM bank module 12, this memory macro MM3 provided with a cache function can be composed at a smaller chip area. The memory macro MM3 provided with such a cache function will thus be integrated with a newly designed arithmetic circuit very suitably, thereby avoiding integration of an existing system provided with a cache function on a chip.

(4) Memory Macro MM4

This memory macro MM4 is provided with a cache function and comprises a cache bank module 11, a main amplifier module 13, a power supply circuit module 14, an access sequence controller module with ID 17, and a write data buffer module 18 selected respectively from the data base 1.

The memory macro MM4 issues identification information (ID) for each entered address so that the ID is output together with the corresponding data. Receiving the ID, the central processing unit CPU can know the correspondence between received address and data. This processing will be described later more in detail. The memory macro MM4 changes address input order and data output order, thereby outputting first-prepared data first. This processing makes it possible to transfer data effectively even when a hit-miss occurs in the cache (when datum is not found in the same line).

As described above for the memory macros MM1, MM2, MM3, and MM4, it is possible to compose a memory macro provided with predetermined functions and a predetermined capacity by combining various function blocks prepared in the memory macro composing data base 1 beforehand according to the target application, as well as by changing the number of those function blocks. It is also possible to prepare various function blocks in the data base 1 in addition to those described above Hereunder, some representative function blocks for composing such a memory macro will be described in detail.

<<DRAM Bank Module>>

Figure 2:
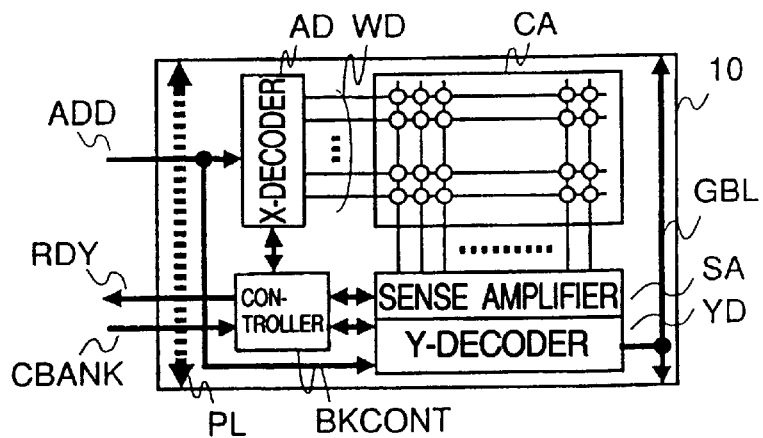
FIG. 2 is a configuration of a DRAM bank module.

FIG. 2 shows a block diagram of this DRAM bank module 10. The DRAM bank module 10 comprises a memory cell array CA, a sense amplifier block SA, a Y decoder YD, an X decoder AD, a controller BKCONT, power supplying line nodes PL, word lines WD, and a global bit line GBL.

The memory cell array CA comprises a plurality of word lines WD, a plurality of bit line pairs, and a plurality of dynamic memory cells (DRAM memory cells) disposed at each intersection point of those word lines and bit line pairs. Each memory cell comprises a transistor and a capacity. Each bit line pair is connected to the sense amplifier block SA.

Although not illustrated in FIG. 2, the sense amplifier block SA includes a pre-charging circuit for reducing the voltage of each bit line pair to a half of the supply voltage, an equalizing circuit for equalizing the potential among the bit line pairs, and sense amplifiers for amplifying the potential of a bit line pair respectively.

Although not illustrated in FIG. 2, the Y decoder includes a column switch (Y switch) for selecting the output of the sense amplifier block SA and a decoding circuit for generating a selection signal for controlling the column switch. The decoding circuit receives part (Y address) of the address signal ADD.

The X decoder AD receives part (X address) of the address signal ADD, which is decoded so as to select a word line WD.

Figure 3:
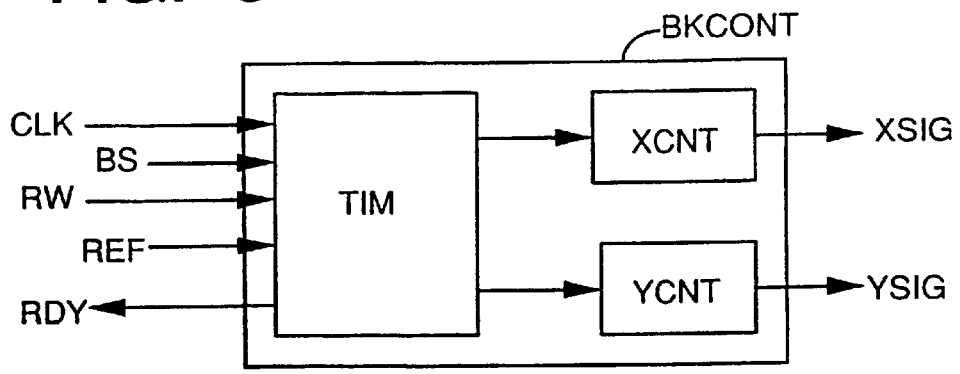
FIG. 3 is a configuration of a controller of the DRAM bank module.

FIG. 3 shows a block diagram of the controller BKCONT. The controller BKCONT comprises a timing generating circuit TIM, an X-related control circuit XCONT, and a Y-related control circuit YCONT. The control signal CBANK includes the clock signal CK, the bank selection signal BS, the read/write selection signal RW, the refresh request signal REF, etc. The timing generating circuit TIM receives the clock signal CLK, the bank selection signal BS, the read/write selection signal RW, etc., thereby generating timing signals necessary for the X-related control circuit XCONT and the Y-related control circuit YCONT. The timing generating circuit TIM also generates the ready signal RDY for notifying each external device that data is ready to be read/written or a refresh cycle is ended. The X-related and Y-related control circuits XCONT and YCONT are composed so as to generate control signals XSIG and YSIG necessary for internal operations of the DRAM bank module 10 respectively.

At least, some of the power supply lines connected to the power supplying line node and the global bit line GBL are disposed so as to pass through the memory cell array CA.

Figure 4:
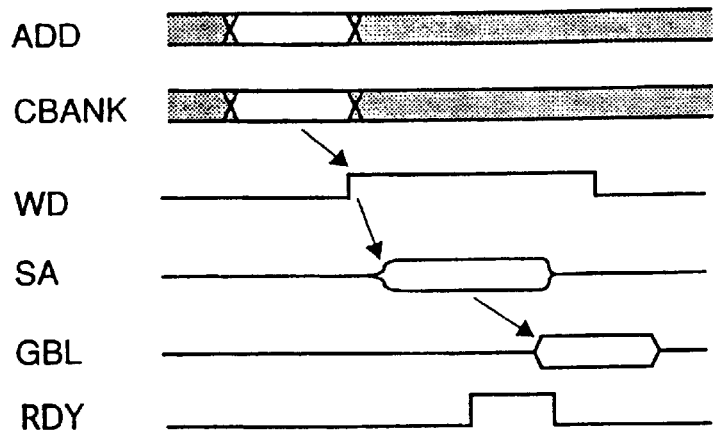
FIG. 4 shows waveforms of the operation of the DRAM bank module.

FIG. 4 shows a timing chart for reading data stored in predetermined memory cells from the DRAM bank module 10. The address signal ADD and the control signal CBANK are decoded, thereby an address entered through the address signal line ADD from external is decoded by the X decoder, then one word line WD is selected (set to the "HIGH" level) when data is read from the object bank. Of the DRAM memory cells in the memory cell array CA, the signal is read from the memory cell selected by the word line WD, then amplified and held by a selected predetermined sense amplifier in the sense amplifier block SA. In addition, the ready signal RDY is set to the "HIGH" level. Of the data read by the selected sense amplifier in the sense amplifier block SA, the data selected by the Y decoder YD is output to external from the DRAM bank module 10 via the global bit line GBL.

Writing of data is also carried out in the same way. The signal entered from a device provided outside a memory bank is transmitted to the sense amplifier block SA via the global bit line GBL, then a word line WD corresponding to the entered address is driven so that the data is written in the object memory cell.

Writing of data into memory cells is also done, just like the read operation shown in FIG. 4, for the selected sense amplifier in a sense amplifier block SA which hold data read from memory cells activated by the selection of a word line WD. The write data obtained through the global bit line GBL is then transmitted to a selected predetermined sense amplifier selected by the Y decoder YD, thereby the data is written into the corresponding memory cells.

The controller BKCONT controls such a series of the above operations according to the signal received through the control signal line CBANK.

The global bit line GBL for entering/outputting data is disposed at a predetermined place so as to be connected to another DRAM bank module 10 and another main amplifier module 13 automatically disposed adjacently.

The power supplying line node PL is disposed at a predetermined place so as to supply an external power to a predetermined circuit in a bank, as well as to another function modules disposed adjacently to itself. Since the global bit line GBL and the power supplying line node PL are disposed at common places to all the function modules such way, function modules can be wired automatically when they are just disposed adjacently to each other. This makes it possible to compose a memory macro quickly.

Especially, such a standardized disposition of function modules makes it possible to minimize the chip area for a larger memory capacity, since DRAM memory cells are used for the DRAM bank module 10. Especially when an arithmetic circuit and a memory are integrated on a chip, such the DRAM bank module 10 that uses DRAM memory cells excellent in integral properties will be most suitable, since an increase of the chip area cannot be avoided in such a case.

<<SRAM Bank Module>>

Figure 5:
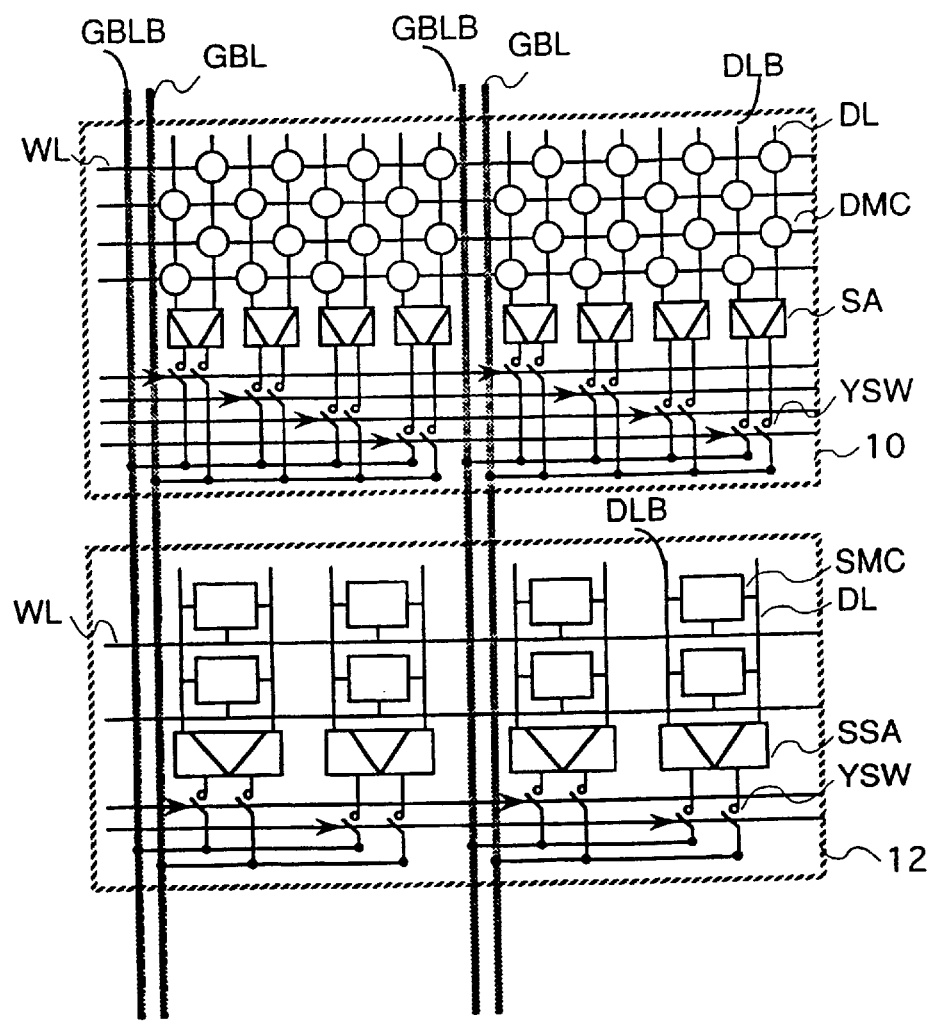
FIG. 5 is an example of the connection between the DRAM bank module and an SRAM bank module.

This SRAM bank module 12 can be composed in the same way as the DRAM bank module 10. In the case of this SRAM bank module 12, however, SRAM memory cells are used for the memory cell array CA. An SRAM memory cell comprises four or six transistors. Since each memory cell can be driven by itself, the sense amplifiers in each sense amplifier block SA is omissible. In addition, since the size of each memory cell differs between the DRAM memory module 10 and the SRAM bank module 12, it is difficult to dispose both of the bank modules 10 and 12 in alignment to the pitches of the common global bit lines GBL. This problem can be avoided, however, by disposing SRAM memory cells SMC in alignment to the pitches of the global bit lines GBL. FIG. 5 shows an example of such the connection between the DRAM bank module 10 and the SRAM bank module 12.

In the DRAM bank module 10 shown in FIG. 5 are shown only the memory cell array CA, sense amplifier blocks SA, and Y switches WSW. The memory cell array CA comprises a plurality of word lines WL, a plurality of bit line pairs DL and DLB, and DRAM memory cells DMC disposed at each intersection point of those word lines and bit line pairs respectively. A sense amplifier block SA is provided for each bit line pair DL and DLB. A global bit line pair GBL and GBLB is disposed for four bit line pairs DL and DLB respectively. In other words, a Y switch YSW makes it possible to connect one of the four bit line pairs DL and DLB selectively to one global bit line pair GBL and GBLB. Signals from the four signal lines for controlling such a Y switch YSW are output from the Y decoder YD.

In the SRAM bank module 12 shown in FIG. 5 are shown only the memory cell array CA, sense amplifier blocks SA, and Y switches YSW. The memory cell array CA comprises a plurality of word lines WL, a plurality of bit line pairs DL and DLB, and SRAM memory cells SMC disposed at each intersection point of those word lines and bit line pairs respectively. A sense amplifier block SSA is provided for each bit line pair DL and DLB. Those sense amplifier blocks SSA may be omissible. A global bit line pair GBL and GBLB is disposed for two bit line pairs DL and DLB respectively. In other words, a Y switch YSW makes it possible to connect one of the two bit line pairs DL and DLB selectively to one global bit line pair GBL and GBLB. Signals from the two signal lines for controlling such a Y switch YSW are output from the Y decoder YD.

As shown in FIG. 5, the number of bit line pairs DL and DLB connected to a global bit line pair GBL and GBLB in the SRAM bank module 12 is less than that in the DRAM bank module 10. Thus, this difference of number between the modules 10 and 12 is adjusted so that the SRAM bank module 12 that uses larger memory cells can be connected to the global bit line pairs GBL and GBLB at the same pitches as those of the DRAM bank module 10.

Although the memory capacity is the same between both bank modules 10 and 12, the necessary chip area becomes larger in the SRAM bank module 12 than in the DRAM bank module 10. However, the operation of the SRAM bank module 12 is faster than that of the DRAM bank module 10. If the memory capacity of the SRAM bank module 12 is reduced (for example, if the capacity is reduced to ¼), the necessary chip area becomes almost the same as that of the DRAM bank module 10. Consequently, the effect for using the SRAM bank module 12 will be more apparent when used for composing a memory macro if the operation speed of the object memory macro is considered most important, as well as if the memory macro is to be used as a cache memory.

<<Cache Bank Module>>

Figure 6:
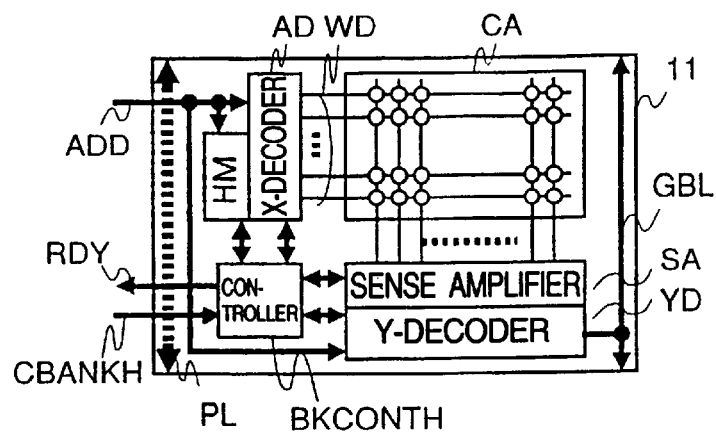
FIG. 6 is a configuration of a cache bank module.

FIG. 6 shows a block diagram of this cache bank module 11. This cache bank module 11 comprises a memory cell array CA, a sense amplifier block SA, a Y decoder YD, an X decoder AD, a controller BKCONT, a power supplying line node PL, word lines WD, a global bit line GBL, and a hit/miss judging circuit HM. The configurations of the items in the cache bank module 11 are the same as those of the DRAM bank module 10 except for the hit/miss judging circuit HM and the controller BKCONT.

Figure 7:
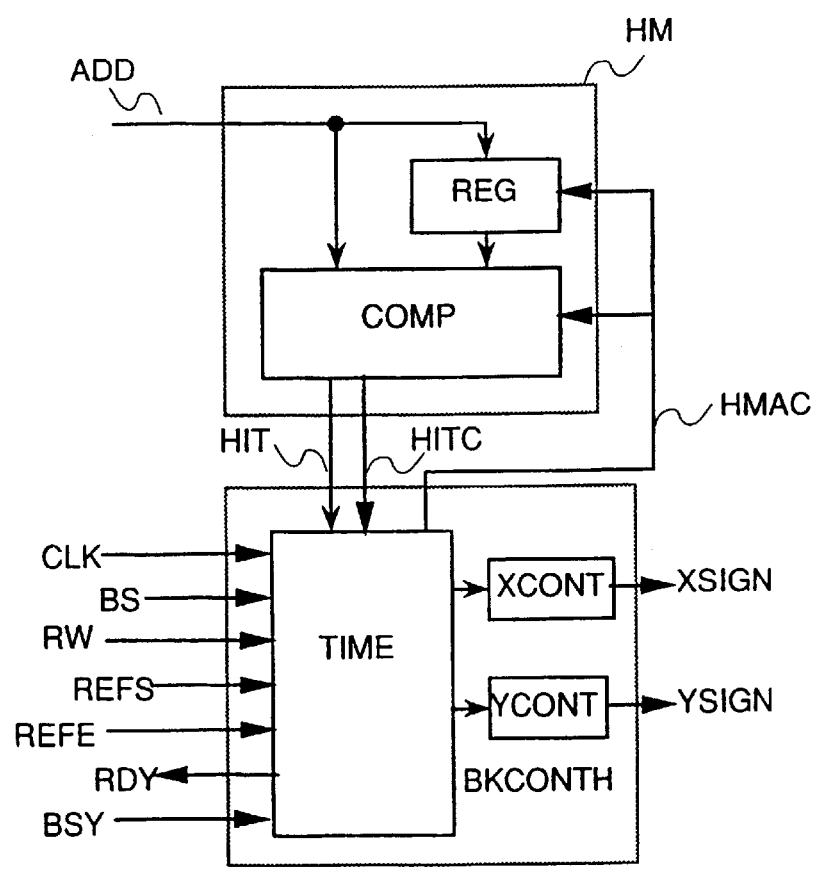
FIG. 7 is a block diagram of a hit/miss judging circuit and a controlling circuit included in the cache bank module.

FIG. 7 shows block diagrams of the hit/miss judging circuit HM and the controller BKCONT. The hit/miss judging circuit HM comprises a register REG for holding the last accessed address and a comparator COMP for comparing a newly entered address with the address held in the register REG. The controller BKCONT comprises a timing generating circuit TIME, an X-related control circuit XCONT, and a Y-related control circuit YCONT. The control signal CBANKH includes the clock signal CLK, the band selection signal BS, the read/write selection signal RW, the refresh request signal REFS, the refresh interruption signal REFE, the busy signal BSY, etc. The timing generating circuit TIME receives the clock signal CLK, the band selection signal BS, the read/write selection signal RW, the refresh request signal REFS, the busy signal BSY, etc., thereby generating timing signals necessary for the X-related and Y-related control circuits XCONT and YCONT. The timing generating circuit TIME also generates the ready signal RDY for notifying an external device that data is ready to be read or written and a refresh cycle is ended. The X-related and Y-related control circuits XCONT and YCONT are composed respectively so as to generate control signals XSIGN and YSIGN necessary for internal operations of the cache bank module 11.

Hereunder, the operations of the hit/miss judging circuit HM and the controller BKCONTH will be described. The bank selection signal BS is entered to the timing generating circuit TIME. The timing generating circuit TIME judges whether or not an object bank is to be selected and sets the control signal HMAC in a predetermined state according to the result of the judgment. If the bank is judged to be selected, the control signal HMAC activates the comparator COMP. An address ADD is entered to both comparator COMP and register REG. The register REG then outputs the last accessed address held in itself to the comparator COMP. If the bank is judged not to be selected, the control signal HMAC deactivates the comparator COMP. Thus, the address ADD is not entered to any of the comparator COMP and the register REG.

The comparator COMP compares a new address with an old address. If the new and old X addresses match, it is judged to be a hit and the hit signal HIT is set to the "HIGH" level. If the new and old X and Y addresses match such way, the hit signal HITC is set to the "HIGH" level. The new address entered to the register REG is thus held until it is confirmed that the next address is entered and compared in the comparator COMP. The held address is used for the next hit judgment.

The controller BKCONTH executes no normal accesses if the hit signal HIT is on the "HIGH" level. Instead, the controller BKCONTH sets the ready signal RDY to "HIGH" and outputs the data held by the sense amplifier block SA to the object global bit line GBL. At this time, the controller BKCONTH just selects an address according to the Y address. Then, the Y-related control circuit YCONT activates the Y decoder YD, so that the data held in the sense amplifier block SA is output to the object global bit line GBL. If the busy signal BSY for indicating that the previous access to another memory bank is not ended yet is on the "HIGH" level, the data held in the sense amplifier block SA are not output to the global bit line GBL.

The controller BKCONTH executes no ordinary access if the hit signal HITC output from the hit judging circuit HM is on the "HIGH" level. Instead, the controller BKCONTH sets the ready signal RDY to "HIGH" and outputs the data held by the main amplifier MA to the data input/output line MAOUT. If the busy signal BSY for indicating that the previous access to another memory bank is not ended yet is on the "HIGH" level, the data held in the main amplifier are not output to the data input/output line MOUT.

If new and old addresses do not match, it is judged to be a miss and the hit signal HIT is set to the "LOW" level. The controller BKCONTH then accesses a memory normally. In other words, the last accessed word line is deactivated and the object bit line is pre-charged. A new word line is thus activated so that the controller BKCONTH accesses an object memory. If data is read by the corresponding sense amplifier block SA, the ready signal RDY is set to "HIGH".

Hereunder, description will be made for a case in which data stored in a predetermined memory cell is read from the cache bank module 11 as usually (for example, a case in which the first memory access request is issued after the predetermined memory cell is refreshed). If data is to be read from an object bank just like the DRAM bank module 10 as shown in FIG. 4, an address entered through the address signal line ADD from external is decoded by the address decoder AD, then one of the word lines WD is selected. After this, the signal in the DRAM memory cell selected by the word line WD in the memory cell array CA is read and amplified, then held by the sense amplifier block SA. At this time, the ready signal RDY is set to "HIGH".

Then, the Y decoder YD selects some of the data held by the sense amplifier block SA and outputs the selected data to a device provided outside the cache bank module 11 through the global bit line GBL.

On the other hand, writing of data into memory cells is done as follows. The data obtained through a global bit line GBL is transmitted to a predetermined sense amplifier selected by the Y decoder. Before this writing, the sense amplifier holds the data read from a memory cell activated due to the selection of a word line WD.

Figure 8:
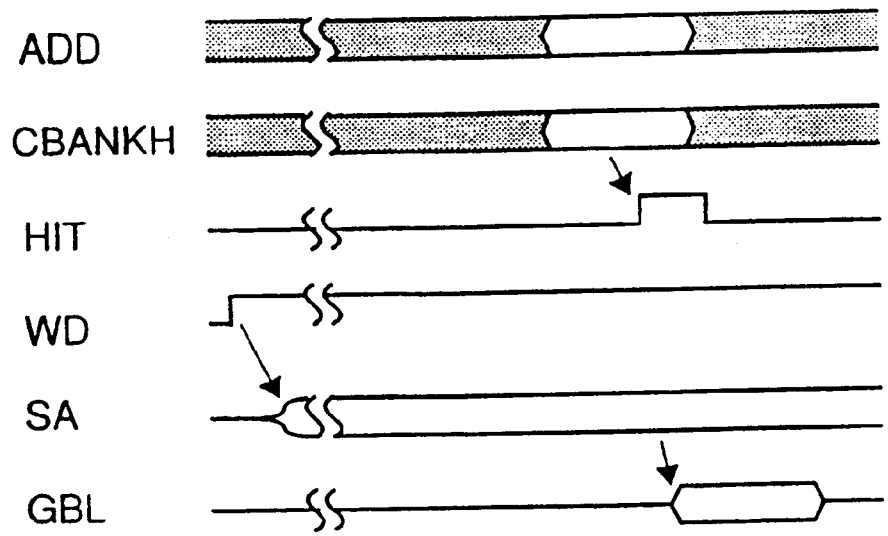
FIG. 8 shows waveforms of the operation of the cache bank module when the operation is judged as a hit.

Next, description will be made for a case in which data is read/written fast using the hit/miss judging function (for example, a case in which a refreshed memory is accessed, then a memory access request is issued for the memory). As shown in FIG. 8, an address entered from external through the address signal line ADD is entered to the X decoder. The address is also entered to the hit/miss judging circuit HM at the same time. The hit/miss judging circuit HM compares the newly entered address with the last entered and held address. If those two addresses match, the hit signal HIT is set to "HIGH". Thus, it is judged that the object data is already read and held by the sense amplifier block SA according to the last entered address. The data held by the sense amplifier block SA is thus output to the global bit line GBL. If those two addresses match in such way, the result of the comparison is judged to be a hit and the operation of the X decoder AD is canceled through the controller BKCONTH, so that no data is read from any of the memory cells.

In the same way, the write operation is executed as follows. If a newly entered address matches with the last entered and held one, the result is judged to be a hit, which means that the data corresponding to the predetermined address is already held by the sense amplifier block SA. Accordingly, the data obtained from a global bit line GBL is transmitted to a predetermined sense amplifier selected by the Y decoder YD without reading any data from the memory cell activated due to the selection of a word line WL.

The controller BKCONTH is also composed so as to set the ready signal RDY to "HIGH" and output the signal notifying the hit to a device provided outside the cache bank module 14. The controller BKCONTH controls such a series of operations according to the signal entered through CBANKH.

Figure 9:
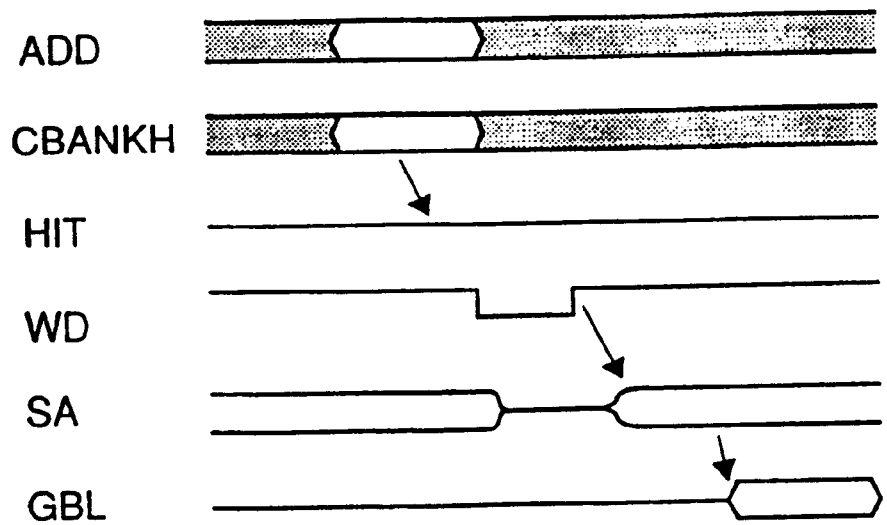
FIG. 9 shows waveforms of the operation of the cache bank module when the operation is judged as a miss.

If the new and old addresses do not match, the result of the comparison is judged to be a miss and the cache function is disabled. FIG. 9 shows a timing chart for such a case. If an address is entered and the comparison with the old address is judged to be a miss, the last accessed word line is deactivated and the bit line connected to the object sense amplifier block SA is pre-charged. After this, the word line corresponding to the new address is activated, then the selected sense amplifier in the sense amplifier block SA is actuated so as to read data from the predetermined memory cell. If a write operation is judged to be a miss, the last accessed word line is deactivated once, then data is written in the predetermined memory cell.

If the comparison between new and old addresses is judged to be a hit when the cache bank module 14 is provided with a hit/miss judging circuit HM such way, part of the read/write operation from/in a memory can be omitted so as to make accesses faster.

Each global bit line GBL for inputting/outputting data is disposed at a predetermined place so as to be connected to another cache bank module 14 and another main amplifier module 13 disposed adjacently to itself.

The power supplying line node PL for supplying an external power to a predetermined circuit in a bank is disposed at a predetermined place so as to able to supply the power to another function modules disposed adjacently to itself. Since the global bit line GBL and the power supplying line node PL are disposed at their standardized places in each function module such way, those modules can be wired automatically as needed when they are just disposed adjacently to other modules. This makes it possible to compose a memory macro quickly. If a small capacity memory macro provided with a cache function is to be composed, the cache bank module 11 can be used, thereby reducing the cache controller module 16 in size. An, this makes it possible to compose a memory macro at a smaller chip area.

<<Main Amplifier Module>>

Figure 10:
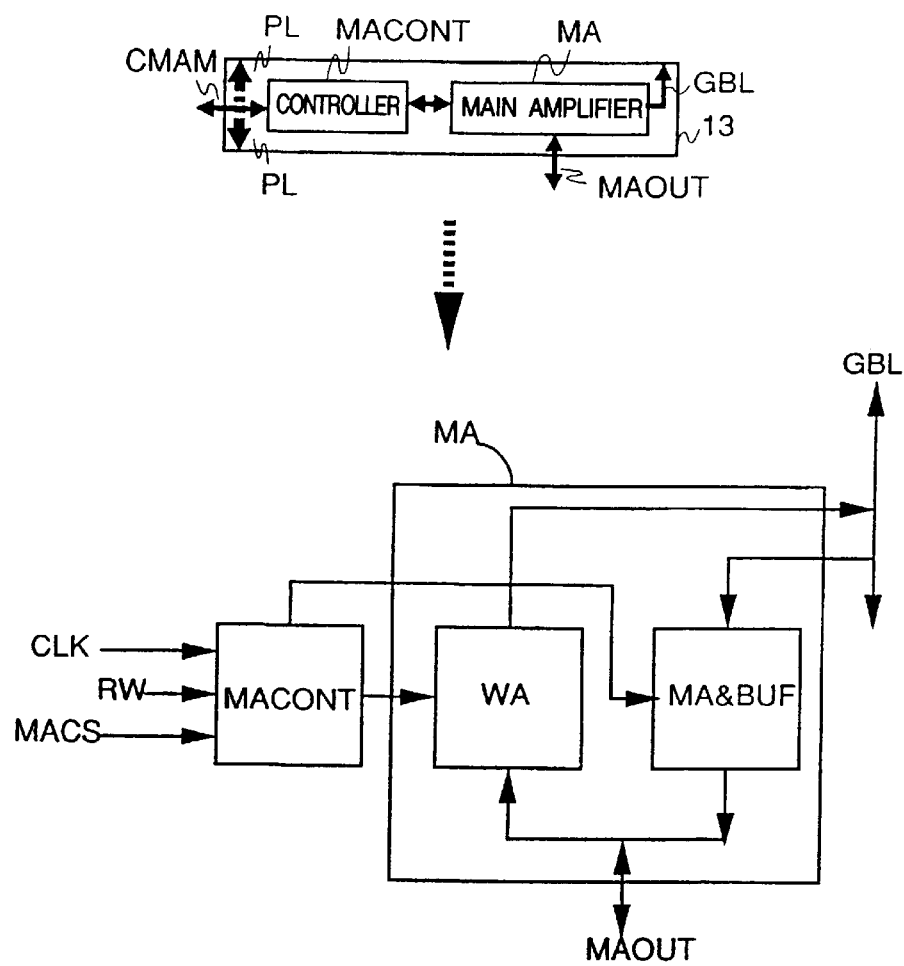
FIG. 10 is a block diagram of a main amplifier module.

FIG. 10 shows a block diagram of this main amplifier module 13. This main amplifier module 13 comprises a main amplifier MA, a controller MACONT for controlling the operation of the main amplifier MA, and a power supplying line node PL. The main amplifier MA comprises a main amplifier/output circuit MA&BUF and a write amplifier WA. The main amplifier/output circuit MA&BUF includes a pre-charging circuit for pre-charging a pair of global bit lines GBL to the supply voltage, an equalizing circuit for equalizing the potential of the pair of global bit lines GBL to the same value, a sense amplifier block SA for amplifying the data of the pair of global bit lines GBL, a latching circuit for latching the output of the sense amplifier block SA, and an output buffer circuit for outputting data to the data input/output line MAOUT. The write amplifier WA includes an input buffer circuit (write amplifier) for receiving data from the data input/output line MAOUT, and other items.

The data entered from a memory bank through a global bit line GBL during a read operation is amplified by the sense amplifier provided in the main amplifier/output circuit MA&BUF, then latched in the latching circuit so as to be output to a device provided outside the memory macro. When in a write operation, the data entered from a device provided outside the memory macro through the data input/output line MAOUT is output to the corresponding global bit line GBL through the input buffer circuit provided in the write amplifier WA.

The controller MACONT controls such a series of operations according to the control signal CMAM such as the clock signal CLK, the read/write selection signal RW, the main amplifier control signal MACS, etc.

The main amplifier module 13 interfaces between a global bit line GBL and the input/output line MAOUT connected to a device provided outside the memory macro such way. Since the main amplifier module 13 controls the object global bit line GBL such way, a memory macro can be composed with a memory capacity to be varied according to the change of the number of memory bank modules.

<<Power Supply Circuit Module>>

Figure 11:
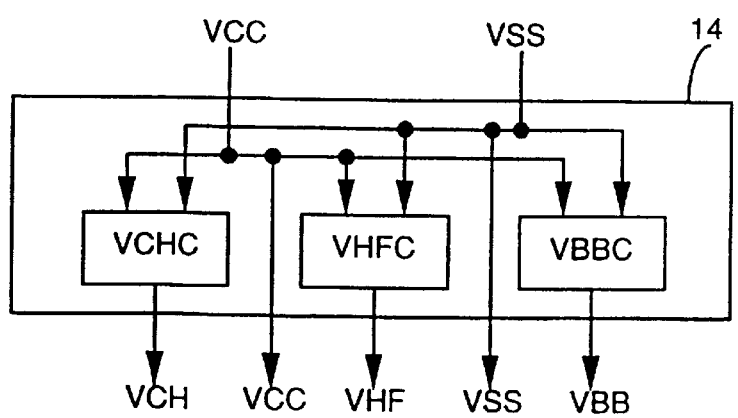
FIG. 11 is a block diagram of a power supply circuit module.

FIG. 11 shows a block diagram of this power supply module 14. This power supply module 14 includes a voltage generating circuit VCHC, a voltage generating circuit VHFC, a voltage generating circuit VBBC, etc. The voltage generating circuit VCHC generates a voltage VCH (used as the word line voltage necessary for the X decoder AD) higher than the voltage VCC supplied from a device provided outside the memory macro. The voltage generating circuit VHFC generates a voltage VHF (a ½ voltage of the voltage necessary for the pre-charging circuit provided in the sense amplifier block SA) lower than the voltage VCC supplied from a device provided outside the memory macro. The voltage generating circuit VBBC generates a voltage VBB (used as the voltage for the substrate provided in the memory cell array (back-bias voltage)) lower than the voltage VSS (ground potential) supplied from a device provided outside the memory macro. The voltages VCC, VSS, VCH, VHF, and VBB are supplied from the power supplying line node PL to each corresponding module.

If only the SRAM bank module 12 is used, the power supply module 14 does not need the voltage generating circuits VBBC, etc., which can thus be omissible from the module 14.

<<Write Data Buffer Module>>

Figure 12:
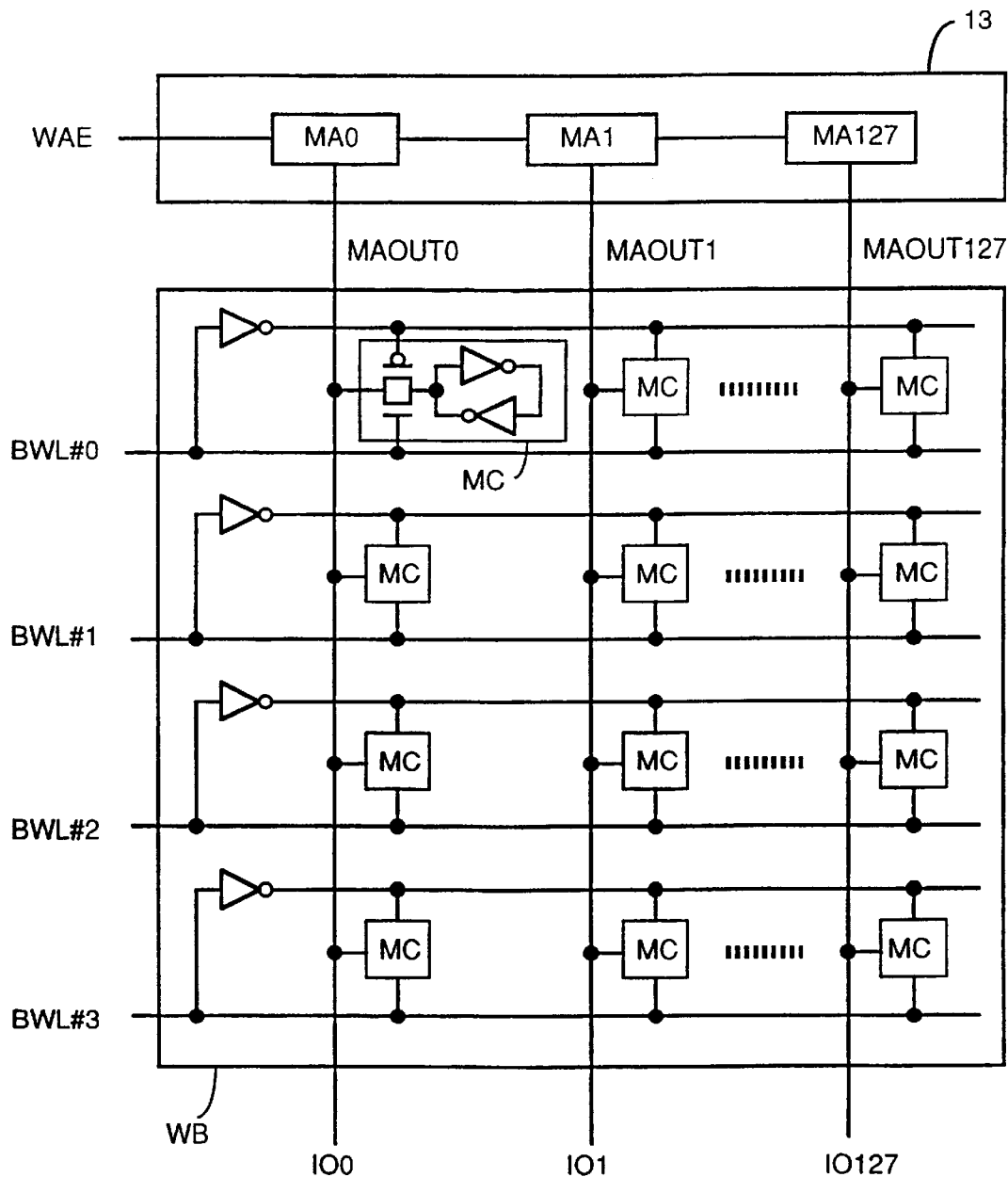
FIG. 12 is an example of the connection between a write data buffer module and the main amplifier module.

FIG. 12 shows an example of the connection between this write data buffer module 18 and the main amplifier module 13. The write data buffer module 18 is composed so as to store the same number of write data items as the number of memory banks temporarily. For example, the write buffer WB of the write data buffer module 18 comprises a memory array of 4 rows by 128 columns used for storing four write data items. Each memory cell MC comprises a storing element composed of both inputs and outputs of two inverter circuits connected to each other and a CMOS transfer gate (composed of a P-channel MOS transistor and an N-channel MOS transistor connected to each other in parallel). Each memory cell MC is connected to a pair of word lines BWL#i(i=0–3) and a data line IO#j(j=0–127). In order to minimize the memory cell area, memory cells MC are disposed at the pitches of the data input/output lines MAOUT of the memory macro MM4.

<<First Example of Memory Macro>>

Figure 13:
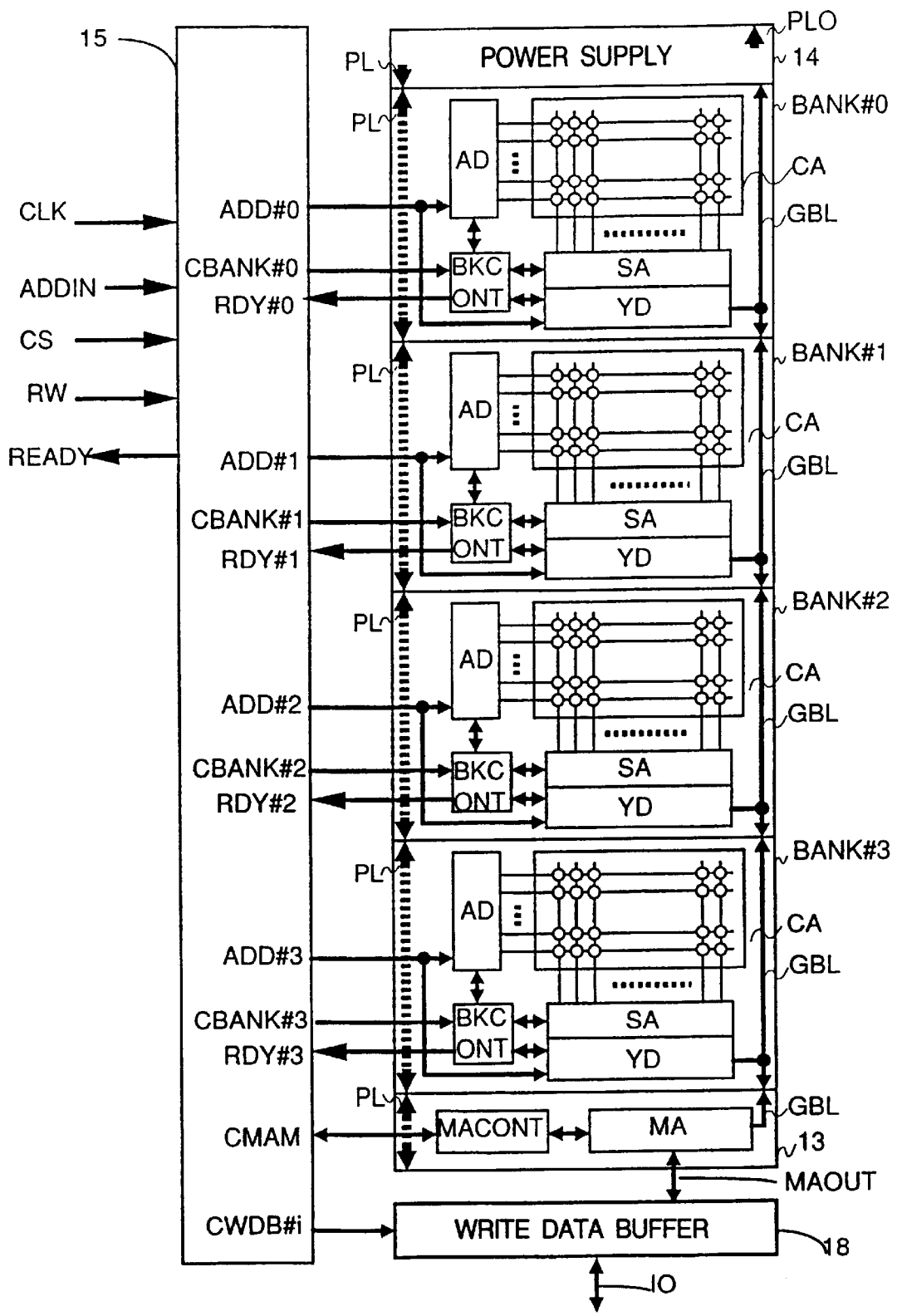
FIG. 13 is a block diagram of a memory macro (the first memory macro example) that uses a DRAM bank module.

FIG. 13 shows a block diagram of the memory macro MM1 composed of memory banks BANK#0, BANK#1, BANK#2, and BANK#3 (comprising a DRAM bank module 10 respectively), as well as a main amplifier module 13, a power supply module 14, a bank controller module 15, and a write data buffer module 18. Function modules are disposed adjacently to those modules, thereby the power supplying line node PL and the global bit line GBL are disposed at predetermined places common to those modules so as to be wired automatically to each other.

The power supplying line node PLO provided in the power supply module 14 receives a power from a device provided outside the memory macro. A power of each function module (the DRAM bank module 10 and the main amplifier module 13) is supplied through the power supplying line node PL after its voltage is raised/fallen by the power supply module 14 as needed. Data is entered/output through a global bit line GBL disposed automatically when each DRAM bank module 10 and the main amplifier module 13 are disposed.

The memory banks BANK#0, BANK#1, BANK#2, and BANK#3 receive/output data from/to the main amplifier module 13 through the global bit line GBL. The main amplifier module 13 receives/outputs data from/to each device outside the memory macro MM1 through the data input/output line MAOUT. Each of the memory banks BANK#0, BANK#1, BANK#2, and BANK#3 is provided with a controller BKCONT, which controls the operation of its corresponding memory bank independently of others. The address signal ADD and the control signal CBANK are entered to each of those memory banks. The signal CMAN controls the main amplifier module 13.

Figure 14:
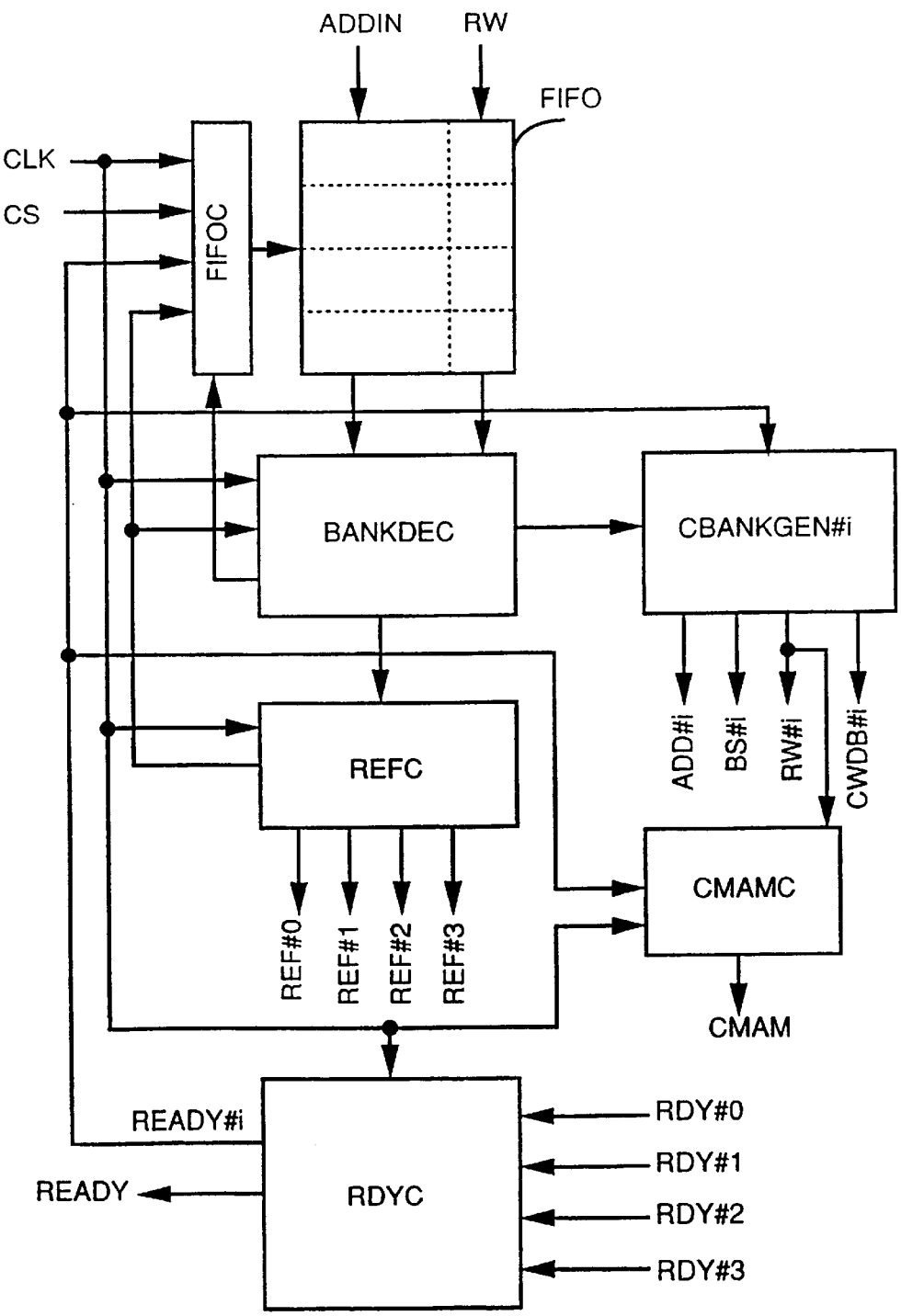
FIG. 14 is a block diagram of a bank controlling circuit module.

FIG. 14 shows a block diagram of the bank controller module 15. This bank controller module 15 comprises a buffer memory FIFO, a buffer memory controller FIFOC, a bank decoder BANKDEC, a bank control signal generating circuit CBANKGEN#i(i=0–3), a refresh controller REFC, a main amplifier control signal generating circuit CMAMC, a ready signal controller RDYC, etc.

The buffer memory FIFO is provided with a function for buffering the address signal ADDIN so as to cope with the address signal ADDIN entered in each clock cycle. If another memory bank is to be accessed, the address signal ADDIN may be entered in each clock cycle. However, if the same memory bank is accessed continuously or again within three clock cycles, it is impossible to access the memory bank immediately. Thus, the address signal corresponding to a plurality of bus cycles ADDIN and the read/write selection signal RW are stored temporarily in the buffer memory FIFO.

The buffer memory controller FIFOC is composed so as to control the buffer memory FIFO.

The bank decoder BANKDEC is composed so as to decide the bank information included in the address signal ADDIN, thereby deciding the memory bank to which an access request is issued. After the ready signal RDY#i of the memory bank set to "HIGH" and the end of the accessing is notified, the bank decoder BANKDEC accesses the same memory bank again.

The bank control signal generating circuit CBANKGEN#i(i=0–3) is composed so as to output the address signal ADD#i(i=0–3) to the objective memory bank, the control signal CBANK (bank selection signal BS#i, RW#i (i=0–3), etc.) and the write data buffer control signal CWDB#i (i=0–3) respectively when the next access is enabled.

The refresh controller REFC is composed so as to output the refresh request signal REF#i(i=0–3) to each memory bank. Receiving the refresh request signal REF#i (i=0–3), each memory bank generates a refresh address in the controller BKCONT, thereby refreshing itself.

Receiving the ready signal RDY#i(i=0–3) from each memory bank, the ready signal controller RDYC generates the ready signal READY#i(i=0–3) for the internal operation of the controller and the ready signal READY to be output to a device provided outside the controller. A memory access requesting device such as the CPU, etc. is composed so as not to issue a new memory access request if the device does not receive the ready signal READY within a predetermined period. Consequently, the buffer memory FIFO never overflows.

The main amplifier control signal generating circuit CMAMC is composed so as to generate the main amplifier control signal CMAM.

Hereunder, the internal operation of the memory macro MM1 will be described. At first, an address is entered during a read operation as described with reference to FIG. 2. Then, data is output from the selected memory bank and transmitted to the main amplifier MA through a global bit line GBL. The data in the main amplifier MA is output to external through the data input/output line MAOUT. On the contrary, when in a write operation, the data entered through the data input/output line MAOUT is output to the global bit line GBL through the main amplifier MA, then transmitted to a predetermined memory bank. Operations such as switching between reading and writing of data from/in the main amplifier MA are controlled using the control signal CMAM.

Since a memory macro is composed with a method for controlling each memory bank separately using the controller BKCONT provided for the memory bank independently and connecting the memory bank to the main amplifier module 14 through a common data I/O line (global bit line GBL), it is possible to increase/reduce the number of memory banks easily, as well as to change the capacity of each memory macro easily. In addition, since the memory macro uses a DRAM bank module 10 that uses DRAM memory cells, a large capacity memory macro can be composed in a small chip area.

Each of the memory banks BANK#0, BANK#1, BANK#2, and BANK#3 may use an SRAM bank module 12 instead of the DRAM bank module 10. If such an SRAM bank module 12 is used to obtain the same memory capacity, the necessary chip area of the memory macro will be increased more than when the DRAM bank module 10 is used, but the operation speed of the memory macro will become faster. Such an SRAM bank module will thus be suitable especially for a memory macro that must operate faster.

Figure 15:
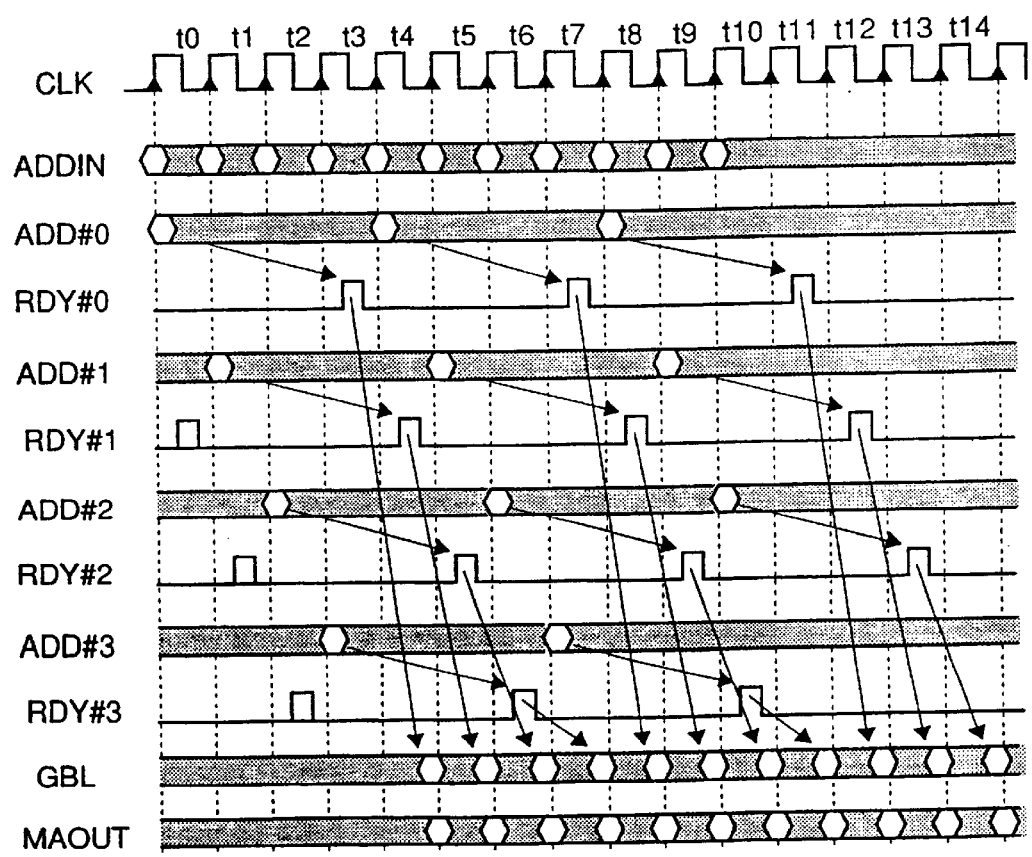
FIG. 15 shows waveforms of the first example of the memory macro.

FIG. 15 shows a timing chart for reading data sequentially from all the memory banks BANK#0, BANK#1, BANK#2, and BANK#3 in the memory macro MM1.

The address signal ADDIN is fetched by the bank controller 15 at the rising edge of the clock signal CLK and used to supply an address to the address signal line ADD of each memory (ADD#0, ADD#1, ADD#2, and ADD#3). Receiving the address signal ADD, each of those memory banks outputs the ready signal RDY#i for indicating that the bank memory is ready to read data three clock cycles later. The data read from each memory cell is output to the global bit line GBL, then output to the data I/O line MAOUT at the rising edge of the clock signal CLK. Each arrow mark shows the correspondence between an address input and a data output to the global bit line GBL. All the latency period for reading data is 5 clock cycles.

Since memory banks are accessed sequentially as described above, data can be read continuously from those memory banks by hiding each access time. For example, if addresses are entered repetitively to different memory banks within a period between t0 and t3 as shown in FIG. 15, it is possible to read all the data from the memory macro MM1 continuously. If the same memory bank is to be accessed continuously, however, four clock cycles must be inserted between accesses.

Generally, when a processor (e.g., a central processing unit: CPU) reads a plurality of data items, the addresses of those data items are consecutive. Thus, in order to read a plurality of data items fast when their addresses are consecutive such way, the addresses of the memory macro MM1 should be assigned so that banks are accessed sequentially if consecutive addresses are entered continuously.

Figure 16:
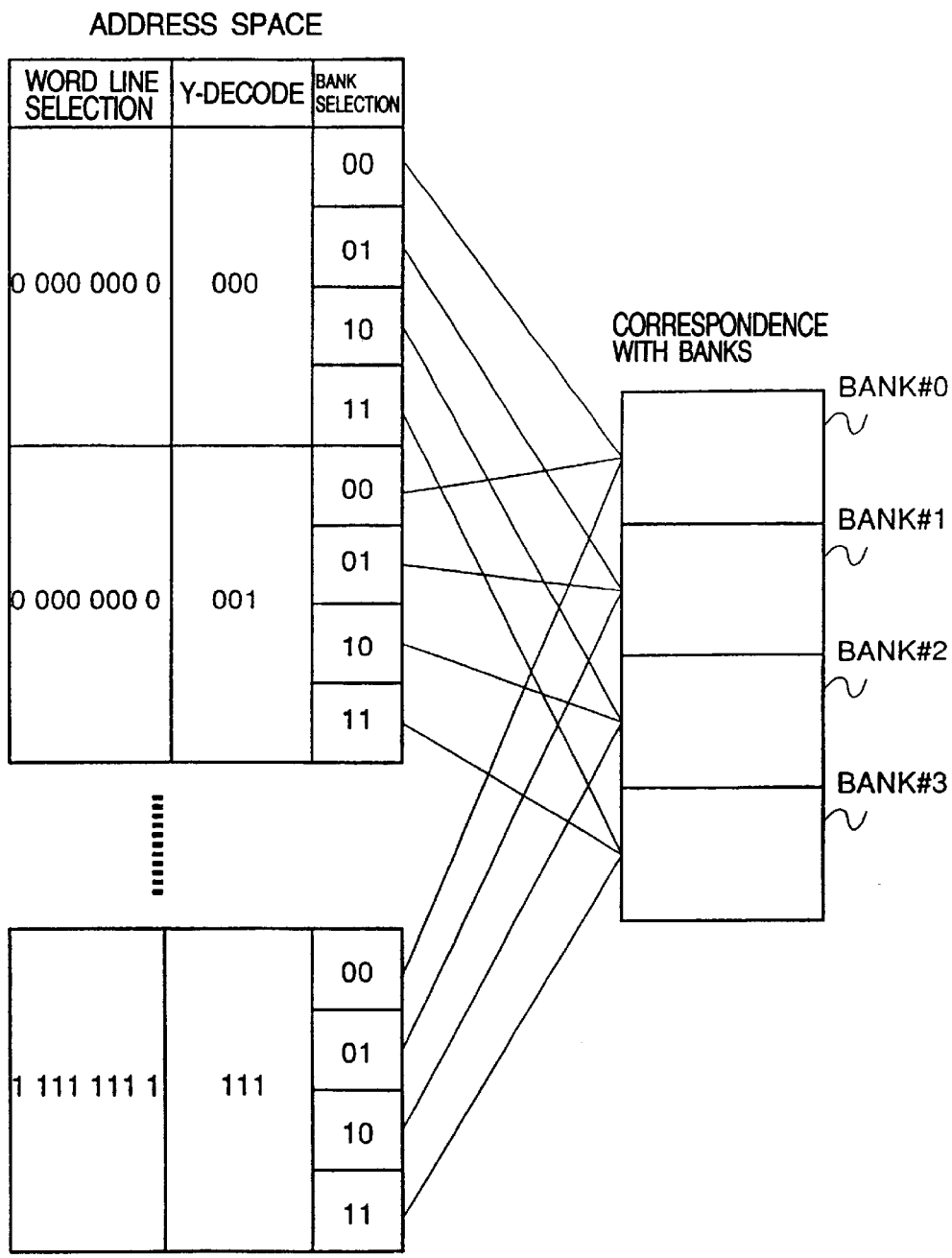
FIG. 16 shows an example of the first address assignment example of the memory macro.

FIG. 16 shows an example for mapping the addresses of the memory macro MM1 so as to access consecutive data items continuously therein. Arrow marks indicate the correspondence between the address space shown on the left side and the four memory banks BANK#0, BANK#0, BANK#2, and BANK#3 shown on the right side in FIG. 16. The DRAM bank module 10 in this case is assumed to have a capacity of 256K bits, so the total capacity of the memory macro MM1 becomes 1M bits.

The addresses necessary for this memory macro MM1 are as follows. At first, 2 bits are necessary for selecting each of the four banks. Then, if the number of sense amplifiers provided in a memory bank is 1024 and the number of the global bit lines GBL is 128, the necessary address space will become 1024/128=8 ways, which means 3 bits when each sense amplifier to be connected to a global bit line is to be selected. In addition, the number of memory cells provided in a memory bank is 256×1024 and if the number of memory cells is divided by the number of sense amplifiers 1024, the result will become 256. Thus, the number of word lines is 256. An address space for selecting one of those 256 word lines is thus 8 bits. The total of those addresses is thus 13 bits. Since the selection of a word line WD to which 8-bit address space is assigned also includes pre-charging of a bit line, the operation of a sense amplifier block SA, the activation of a word line WD, etc., the time will become longer than that of other operations. This is why the addresses of the memory macro may be mapped so as to select a word line WD in another memory bank without selecting the currently accessed memory bank in order to access the addresses faster in order continuously if selection is made for a word line WD that needs much time for changing addresses. FIG. 16 shows an example for mapping the addresses of a memory macro such way. Of the thirteen digits of an address in total, eight digits for selecting a word line WD are assigned to the upper bits and three digits for selecting the Y decoder YD are assigned to the intermediate bits, and two digits for selecting a memory bank are assigned to the lower bits respectively.

For example, the data corresponding to the address 0,000,000,000,000 is read from the memory bank BANK#0. The next address 0,000,000,000,001 indicates the data to be read from the memory bank BANK#1, which follows the memory bank BANK#0. Addresses are assigned sequentially such way so that the data in the address 0,000,000,000,100 is read from the memory bank BANK#0.

If the memory macro MM1 whose addresses are mapped such way is accessed in ascending order of address, then another memory bank, which is different from the currently accessed one, is accessed when a new word line is activated. Thus, the apparent preparing time including the pre-charging of the object can be hidden, enabling continuous data reading. In the memory macro MM1 whose addresses are mapped as shown in FIG. 16, therefore, if consecutive addresses are entered in order, all the bits will be read easily from the memory macro MM1.

The write operation is also done just like the read operation described above. The address signal ADDIN can be entered in every clock cycle. Consequently, write data is also transmitted to the memory macro MM1 in every clock cycle. However, write data cannot always be written into an object memory bank immediately at this time. This is why write data is stored in the write data buffer WDB temporarily. Write data is read from the write data buffer WDB and written into a memory bank when the memory bank is ready to receive data. This write operation is controlled according to the write buffer control signal CWDB#i. In other words, one of the word lines BWL of the write buffer WB is selected, then write data is written into the word line. After this, when the subject memory bank is ready to receive data, a word line BWL is selected again and the write data is output to the data line 10. Then, the write amplifier enable signal WAE is activated and the write data output to the data line 10 is output to the global bit line GBL by the write amplifier provided in the main amplifier MA#i.

<<Second Example of Memory Macro>>

Figure 17:
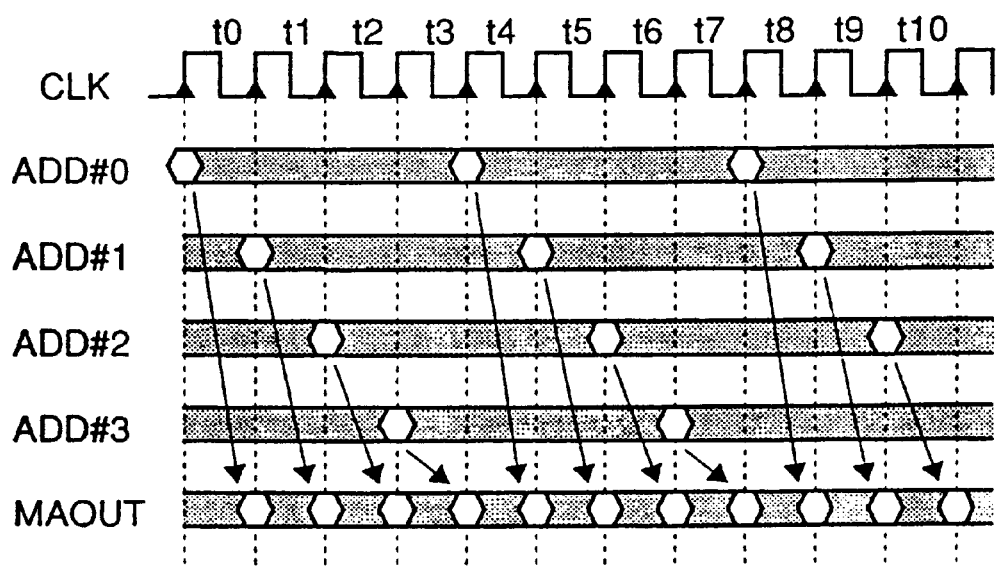
FIG. 17 shows waveforms of the operation of a memory macro (the second memory macro example) that uses an SRAM bank module.

If an SRAM bank-module 12 is used as each memory bank in the memory macro MM1, the operation of the memory macro will become faster. FIG. 17 shows a timing chart for reading data from a memory macro composed of four SRAM bank modules 12. Since only one clock cycle is needed for the latency in this case, data can be read faster than when DRAM bank modules 10 are used as memory banks.

The memory macro MM2 may also be composed of four DRAM bank modules 10 and two SRAM bank modules 12 as shown in FIG. 1. In this case, the operation of the memory macro MM2 will become faster than that of a memory macro, which uses six DRAM bank modules 10. In addition, the necessary chip area of the memory macro MM2 can be reduced more than that of a memory macro which uses six SRAM bank modules 12.

If a memory bank is composed of a combination of memory banks, each of which can be controlled independently, it would be very easy to compose memory macros provided with functions and performances different from each other as described above. If such various memory banks are prepared, each object memory macro will be enhanced more in function.

<<Third Example of Memory Macro>>

Figure 18:
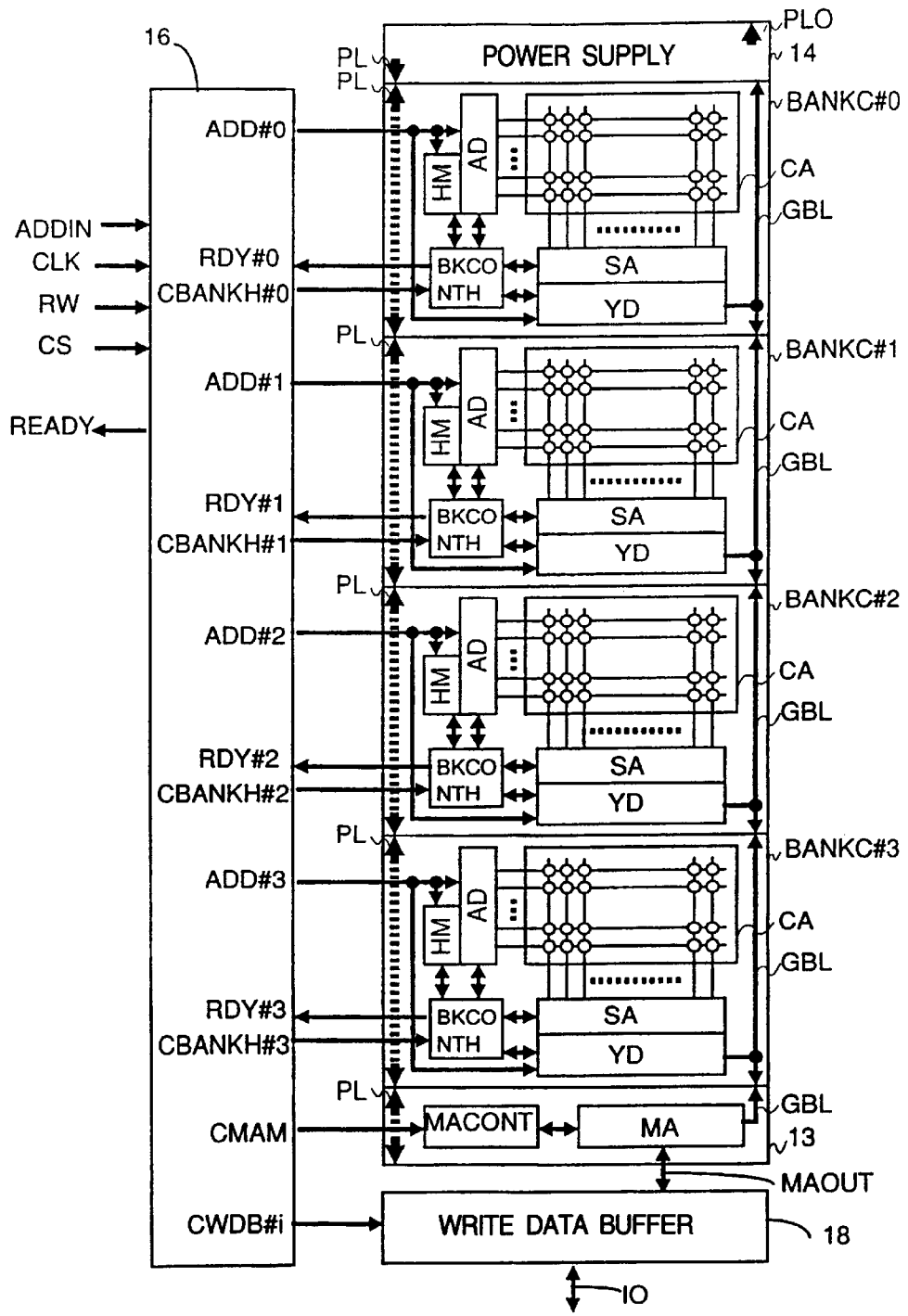
FIG. 18 is a block diagram of a memory macro (the third memory macro example) that uses a cache bank module.

FIG. 18 shows a block diagram of the memory macro MM3 provided with a cache function. The memory macro MM3 comprises four memory banks BANKC#0, BANKC#1, BANKC#2, and BANKC#3, each of which is a cache bank module 11. The memory macro MM3 also includes a main amplifier module 13, a power supply module 14, a cache controller module 16, and a write data buffer module 18.

The cache function of the memory macro MM3 can hold the data read from a memory cell activated by a word line activated once in a sense amplifier temporarily so that the data held in the sense amplifier is output without activating the same word line again if the next accessed data is on the word line used for the last accessed data.

Figure 19:
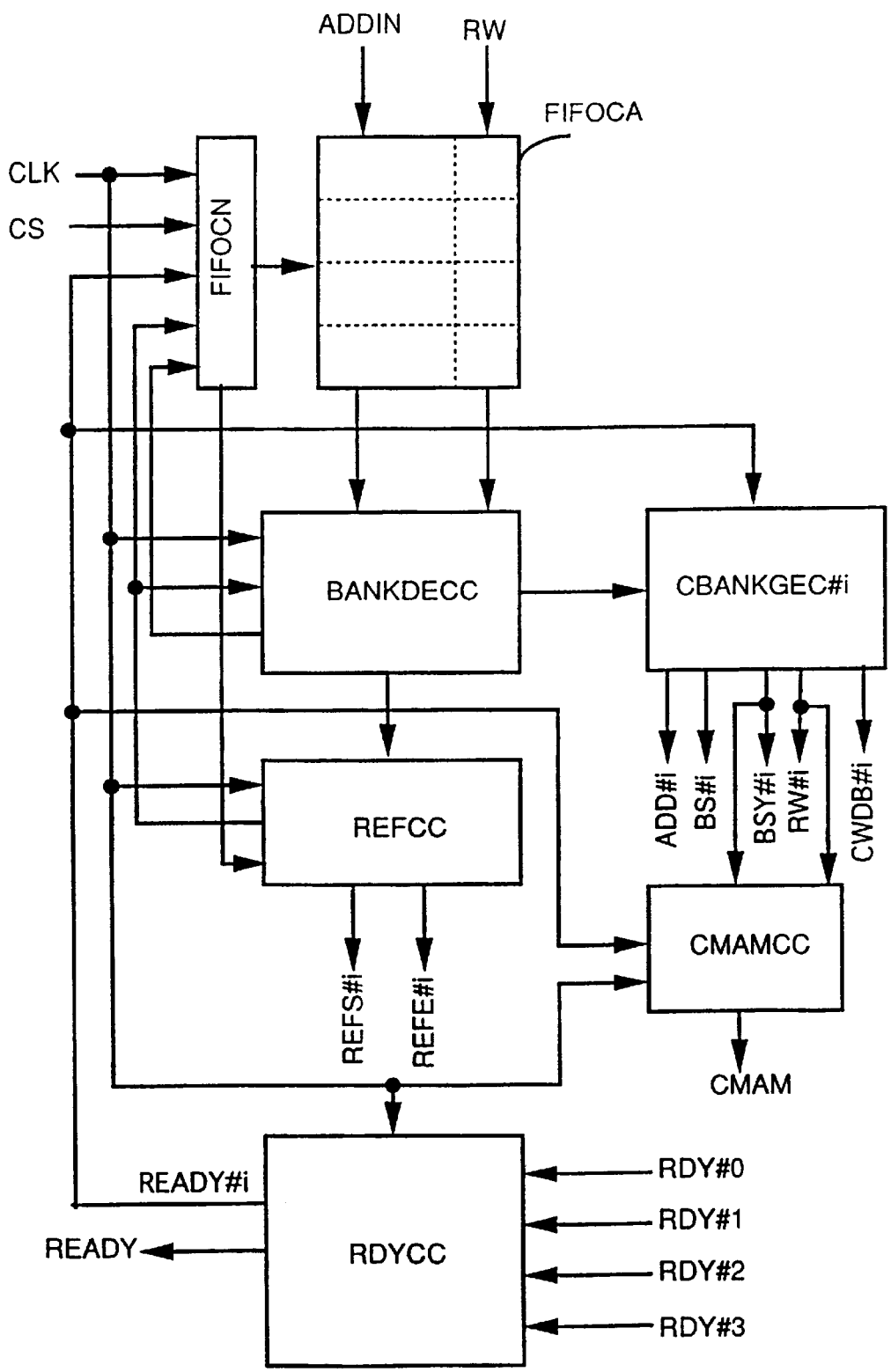
FIG. 19 is a block diagram of a cache controller.

FIG. 19 shows a block diagram of the cache controller module 16. The cache controller module 16 comprises a buffer memory FIFOCA, a buffer memory controller FIFOCN, a bank decoder BANKDECC, a bank control signal generating circuit CBANKGEC#i(i=0–3), a refresh controller REFCC, a main amplifier control signal generating circuit CMAMCC, a ready signal controller RDYCC, etc.

The buffer memory FIFOCA is provided with a function for buffering the address signal ADDIN so as to cope with the input of the address signal ADDIN in every clock cycle. When accessing a memory bank to be hit, the address signal ADDIN may be entered in every clock cycle. However, when accessing a memory bank not to be hit, it is impossible to access the memory bank immediately. Therefore, the buffer memory FIFO stores the address signal ADDIN and the read/write selection signal RW temporarily. The addresses ADDIN and RW correspond to a plurality of bus cycles.

The buffer memory controller FIFOC is composed so as to control the buffer memory FIFOCA.

The bank decoder BANKDECC is composed so as to decode the bank information included in the address signal ADDIN and decide a memory bank to which an access request is issued.

The bank control signal generating circuit CBANKGEC#i (i=0–3) is composed so as to output the address signal ADD#i(i=0–3) issued to a memory bank to which an access request is issued, as well as the control signal CBANKH (bank selection signal BS#i, the RW#i(i=0–3), BSY#i(i=0–3), etc.) and the write data buffer control signal CWDB#i (i=0–3).

The refresh controller REFCC is composed so as to output the refresh request signal REFS#i(i=0–3) and the refresh interruption signal REFE#i(i=0–3) to each memory bank. Receiving the refresh request signal REFS#i (i=0–3), the subject memory bank generates a refresh address in the controller BKCONTH, thereby refreshing itself. Receiving the refresh interruption signal REFE#i(i=0–3), the subject memory bank stops the refreshing. If the refreshing is ended or paused, the controller BKCONTH outputs the ready signal RDY#i (i=0–3).

The ready signal controller RDYCC, when receiving the ready signal RDY#i (i=0–3) from a memory bank, generates the ready signal READY#i(i=0–3) to be used for the internal operation of the controller and the ready signal READY to be output to a device outside the controller. If the ready signal READY is not entered within a predetermined period, the subject memory access requesting device such as the CPU, etc. is prevented from issuing any more memory access. Consequently, the buffer memory FIFOCA never overflows.

The main amplifier control signal generating circuit CMAMCC generates the main amplifier control signal CMAM.

Figure 20:
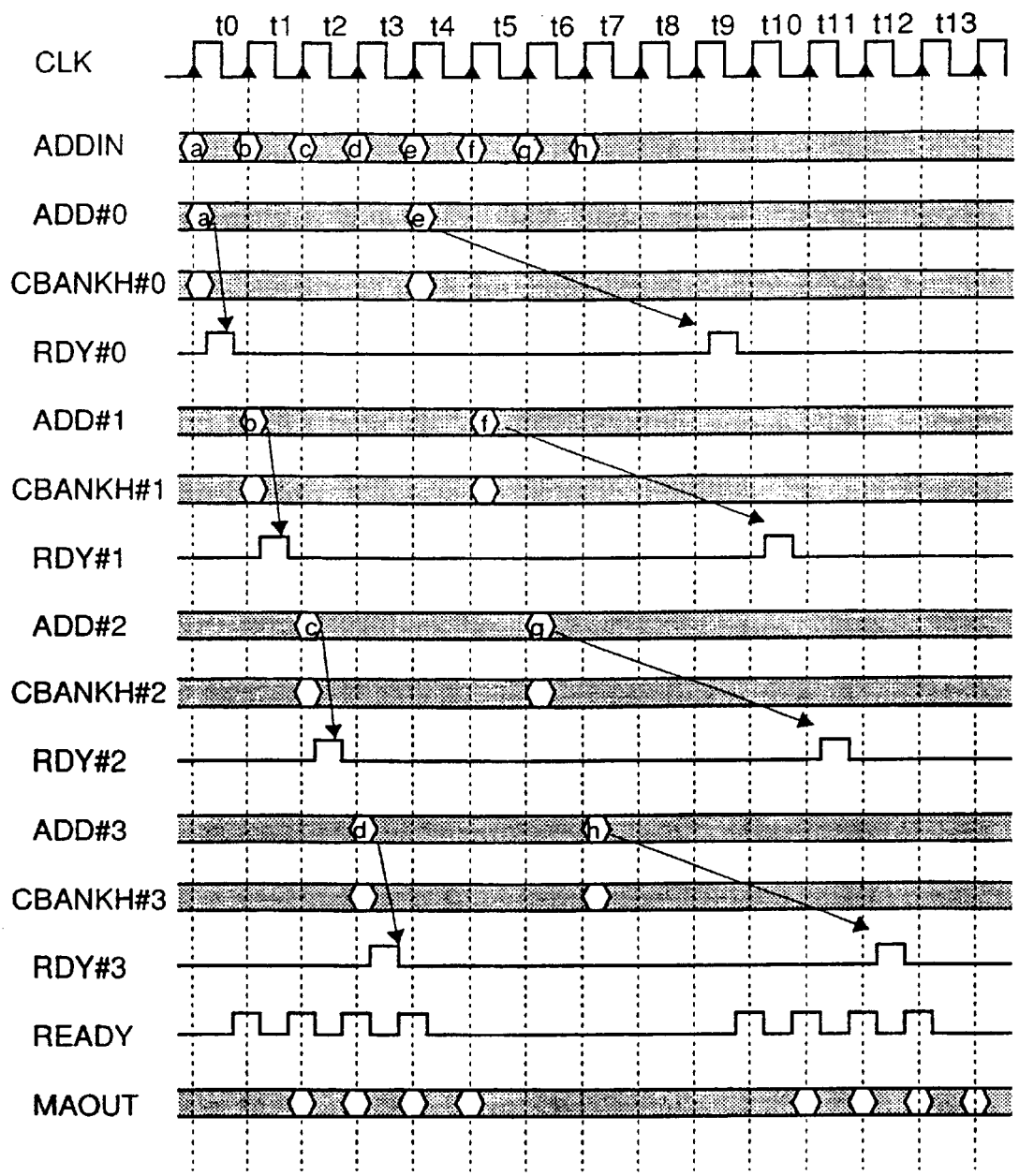
FIG. 20 shows waveforms of the operation of a memory macro in the third example.

Next, the operation of the memory macro MM3 will be described. FIG. 20 shows a timing chart for the operation of the memory macro MM3. If an address is entered to the cache controller module 16 through the address signal line ADDIN, the cache controller module 16 accesses the memory bank corresponding to the address. In the addressed memory bank, the hit/miss judging circuit HM judges whether or not the address matches with the last accessed address. If the addresses match, it is judged that the object data is already read and held in the sense amplifier block SA according to the old address. The result of the judgment is thus notified to the cache controller module 16 through the ready signal line RDY#i. The cache controller module 16 then outputs the ready signal RDY#i to the object external device as the ready signal READY.

The data held in the sense amplifier block SA is thus selected by the Y decoder and output from the MAOUT through the global bit line GBL and the main amplifier MA. However, this data output from the MAOUT through the global bit line GBL and the main amplifier MA is suspended until the main amplifier is notified of the busy signal BSY#i set to "LOW" and the end of the previous access to another memory bank.

If the cache is hit such way (if the same page is accessed again), it is possible to omit both pre-charging of the data line and activation of the word line, etc., thereby making the operation faster than normal accessings. In addition, since part of the operation is omitted such way, the power consumption can also be suppressed.

Since two clock cycles can be used for the latency to output data if a cache is hit such way, it is possible to operate the DRAM memory macro faster, although its chip area is small.

If the addresses do not match, the memory is accessed normally after the word line is deactivated and the dateline is pre-charged.

As described in the first memory macro example, if a processor (e.g., CPU) reads a plurality of data items, generally the addresses of those data items are often consecutive. In order to read the data from such consecutive addresses faster, therefore, addresses of the memory macro MM3 should be assigned so that those addresses are accessed in order of memory bank when consecutive addresses are entered.

Figure 21:
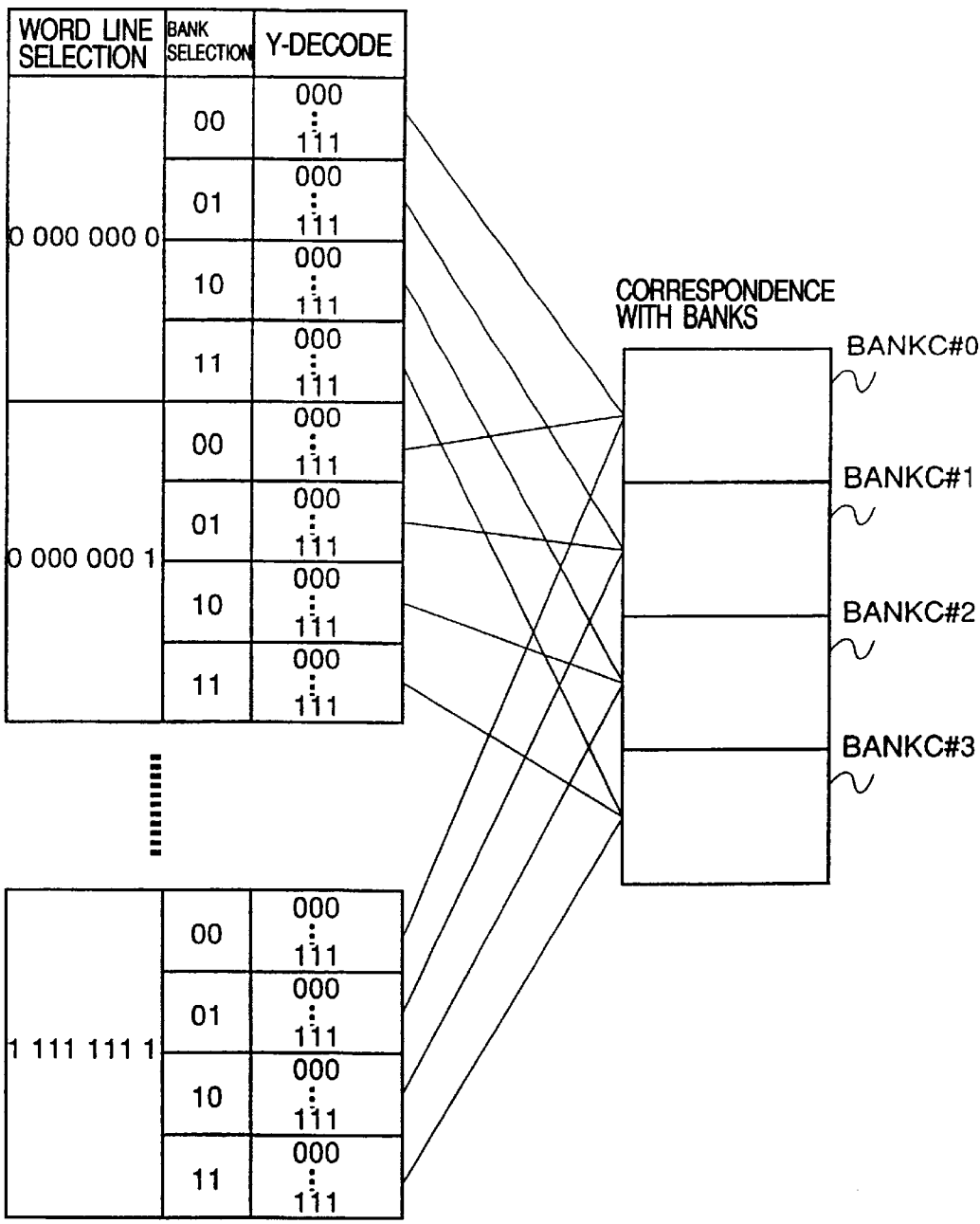
FIG. 21 shows an address assignment example of a memory macro in the third example.

FIG. 21 shows an example for mapping the addresses of the memory macro MM3 so that data can be accessed continuously in the memory macro MM3. Arrow marks indicate the correspondence between the address space shown on the left side and the four memory banks BANK#0, BANK#1, BANK#2, and BANK#3 shown on the right side in FIG. 21. The DRAM bank module 10 in this case is assumed to have a capacity of 256K bits, so the total capacity of the memory macro MM3 becomes 1M bits.

The addresses necessary for this memory macro MM3 are as follows. At first, 2 bits are necessary for selecting each of the four banks. Then, if the number of sense amplifiers provided in a memory bank is 1024 and the number of the global bit lines GBL is 128, the necessary address space will become 1024/128=8 ways, which means 3 bits if each sense amplifier to be connected to a global bit line is selected. In addition, the number of memory cells provided in a memory bank is 256×1024 and if the number of memory banks is divided by the number of sense amplifiers 1024, the result is 256. Thus, the number of word lines will become 256. An address space for selecting one of those 256 word lines is thus 8 bits. The total of those addresses is thus 13 bits. Since the selection of a word line WD to which 8-bit address space is assigned also includes pre-charging of a bit line, the operation of a sense amplifier block SA, the activation of a word line WD, etc., the time will become longer than that of other operations. This is why the addresses of the memory macro may be mapped so as to select a word line WD in another memory bank without selecting the currently accessed memory bank in order to access the addresses faster in order continuously if selection is made for a word line WD that needs much time for changing addresses.

FIG. 21 shows an example for mapping the addresses of a memory macro such way. Of the thirteen digits of an address in total, eight digits for selecting a word line WD are assigned to the upper bits and two digits for selecting a memory bank are assigned to the intermediate bits, and three digits for the selection by the Y decoder YD are assigned to the lower bits respectively.

For example, the data existing between addresses 0,000,000,000,000 and 0,000,000,000,111 is read from the memory bank BANK#0 through a word line WD. The lower three bits are used to indicate the selection by the Y decoder YD. The lower fourth and fifth bits are used to select a bank. The data existing between the next addresses 0,000,000,001,000 and 0,000,000,001,111 exist on a word line WD in the next memory bank BANK#1 which follows the memory bank BANK#0. Addresses are assigned cyclically such way, so that the data existing between the addresses 0,000,000,100,000 and 0,000,000,100,111 become again data on the word line WD of the memory bank BANK#0.

If the memory macro MM3 whose addresses are mapped such way is accessed in order of address, then another memory bank, which is different from the currently accessed one, is accessed when a new word line is activated. Thus, the apparent preparing time including the pre-charging of the object item can be hidden, thereby it is possible to read data continuously. In the memory macro MM3 whose addresses are mapped as shown in FIG. 16, therefore, if consecutive addresses are entered sequentially, all the bits can be read easily from the memory macro MM3. According to this method, the data in the memory cells activated by a word line activated once is read completely. It is thus possible to minimize the power consumption required for reading data from consecutive addresses.

The write operation is also done just like the read operation described above. The address signal ADDIN can be entered in every clock cycle. Consequently, write data is also transmitted to the memory macro MM3 in every clock cycle. In this case, however, write data cannot always be written into each memory bank immediately. This is why write data is stored in the write data buffer WDB temporarily. The write data is read from the write data buffer WDB and written into a memory bank when the memory bank is ready to receive data. This write operation is controlled according to the write buffer control signal CWDB#i. In other words, one of the word lines BWL of the write buffer WB is selected and write data is output to the word line. After this, when the subject memory bank is ready to receive data, a word line BWL is selected again and the write data is output to the data line 10. Then, the write amplifier enable signal WAE is activated and the write data output to the data line 10 is then output to the global bit line GBL by the write amplifier provided in the main amplifier MA#i.

Since a cache hit miss (page hit miss) has occurred for the address entered in the period t4 shown in FIG. 20 and the memory bank BANK#0 is accessed normally after the word line is deactivated once, then the data line is pre-charged, the latency value is increased to seven clock cycles. If a hit miss occurs while a sense amplifier block SA is used as a cache such way, therefore, the memory is accessed normally after the word line is activated and the data line is pre-charged. Thus, such the operation comes to be confronted with a problem that the access time becomes longer than a case in which data is read normally without using the cache function.

In addition, the memory banks corresponding to the addresses entered in the periods t5, t6, and t7 are hit respectively as shown in FIG. 20 and the cache function can be used to output data faster. In spite of this, since the cache function is disabled for the address entered in the period t4, the operation of the CPU for the data outputting corresponding to the addresses entered in and after the period t5 is limited dominantly, thereby the cache function is not used effectively. In this example, a cache hit miss disables the output of subsequent data, but the refresh operation of DRAM memory cells will also cause a congestion of data output sometimes.

Figure 22:
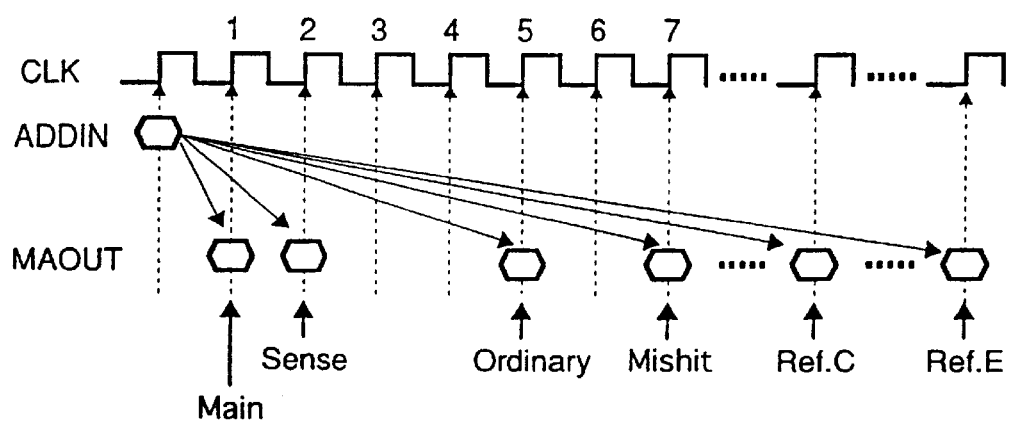
FIG. 22 shows the latency of a memory macro in the third example.

FIG. 22 shows various latency values of the memory macro MM3. The latency values shown in FIG. 22 are assumed between when the address signal ADDIN is entered and when data is output to the data I/O line MAOUT. If the data held in the main amplifier MA is hit, the data is output at a latency value 1 as shown with "Main". If the data held in the sense amplifier block SA is hit, the data is output at a latency value 2 as shown with "Sense". If a memory bank is accessed normally, the data is output at a latency value 5 as shown with "Ordinary". If a miss occurs, the data is output at a latency value 7 as shown with "Mishit". If the subject DRAM is in a refresh cycle, the latency for reading data after the refreshment is ended takes various values as shown with "Ref.E".

If it is impossible to read data until the end of the refreshment of a memory macro comprising DRAM memory banks in a system enhanced for faster operations with the cache function, the system performance will be degraded significantly. To avoid such the problem, therefore, the refreshment of the memory macro may be started earlier. If a memory access request is issued during such a refreshment, the refreshment may be stopped once, then restarted after the memory access request is processed. The latency for outputting data while the refreshment is stopped once such way will take a value as shown with "Ref.C" in FIG. 22. If a memory macro is composed of DRAM memory banks and provided with the cache function as described above, the memory macro must correspond to various latency values.

In addition, if a memory bank is accessed at various latency values, data output will often be suspended depending on the address input order. For example, if an address that hits a sense amplifier cache in another memory bank is entered just after an address entry to a memory bank that being refreshed, the data read from the cache of the sense amplifier block SA can usually be output earlier, but the data output must be suspended until the output of the data read according to the address entered earlier is ended.

<<Fourth Example of Memory Macro>>

Figure 23:
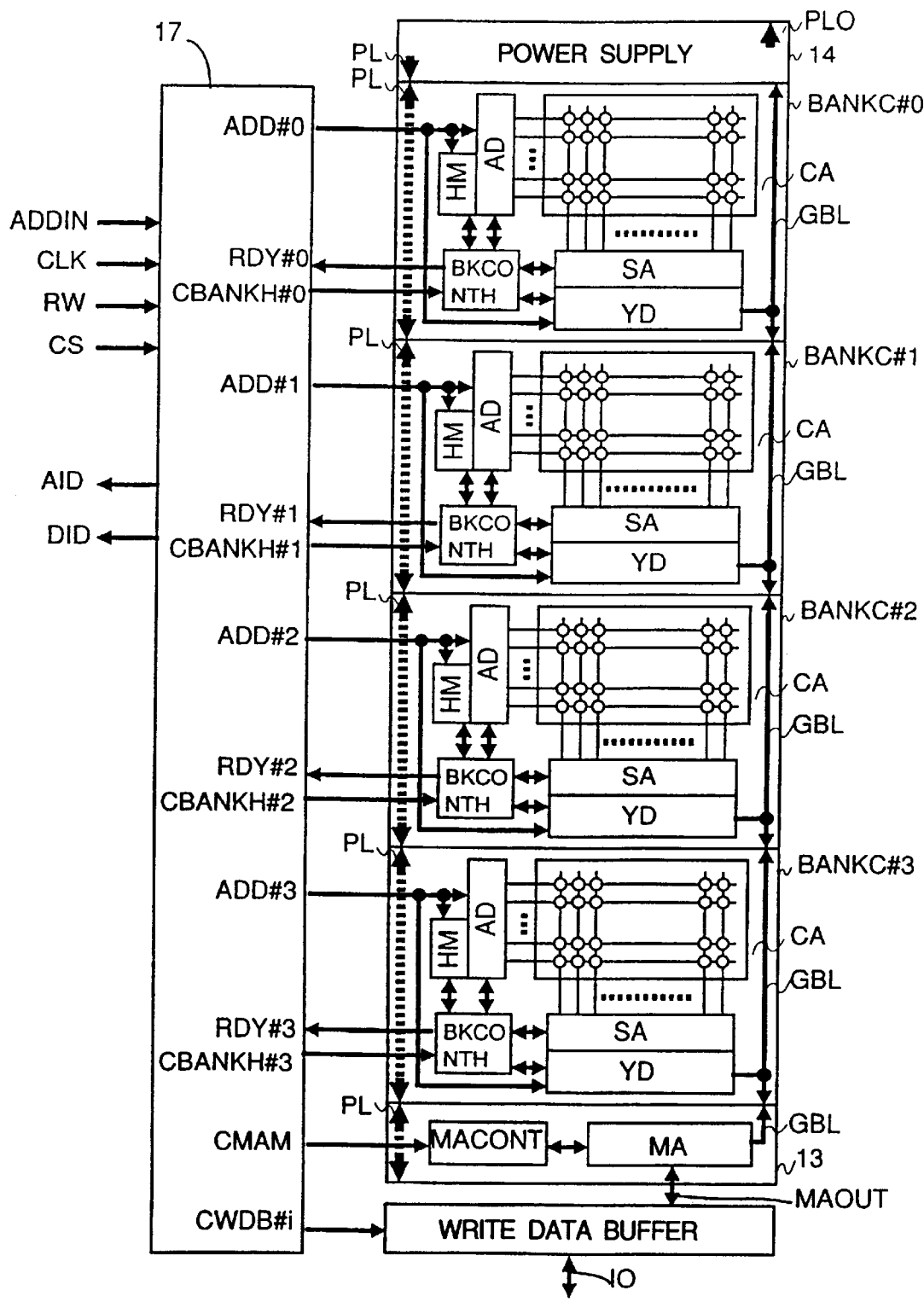
FIG. 23 is a block diagram of a memory macro (in the fourth example) that is provided with an access sequence controller with ID.

FIG. 23 shows a block diagram of this memory macro MM4 that outputs address and data ID signals. This memory macro MM4 is provided with an access sequence controller module with ID 17 instead of the cache controller module 16 provided for the memory macro MM3. The access sequence controller module with ID 17 outputs two ID signals as address ID signal AID and data ID signal DID, thereby outputting the data corresponding to a later-entered address earlier if it is enabled regardless of the address input order. This makes it possible to access memory banks faster.

Hereunder, the operation of such the memory macro MM4 will be described briefly. If an address is entered through the address signal line ADDIN, the access sequence controller module with ID 17 is instructed to decide an ID number corresponding to the entered address and outputs the ID number as the address ID signal AID. The output ID number is held by the memory accessed processor until the data arrives. On the other hand, the access sequence controller module with ID 17 accesses the memory bank corresponding to the entered address, outputs the read data, and outputs the ID number assigned at the address inputting as the data ID signal DID. Receiving both data and ID number, the processor compares the ID number received from the access sequence controller module with ID 17 when in accessing of the memory bank with the ID number received together with the data. If both ID numbers match, the processor makes the address and the data be corresponded to each other. Since an address can be corresponded to data via an ID number such way, it is no need to match the order of address input with the order of data output when in accessing of a memory bank, although it is indispensable in the prior art. As described above, even when memory accesses are done continuously at different latency values, which becomes a problem for composing a memory macro comprising DRAM memory banks and provided with the cache function, first-prepared data can be output first regardless of the order of address input, and data assigned to a larger latency value can be output later, since address and data can be corresponded through an ID number respectively. Consequently, memory banks can be accessed more effectively with such the correspondence between address and data through each ID number.

Figure 24:
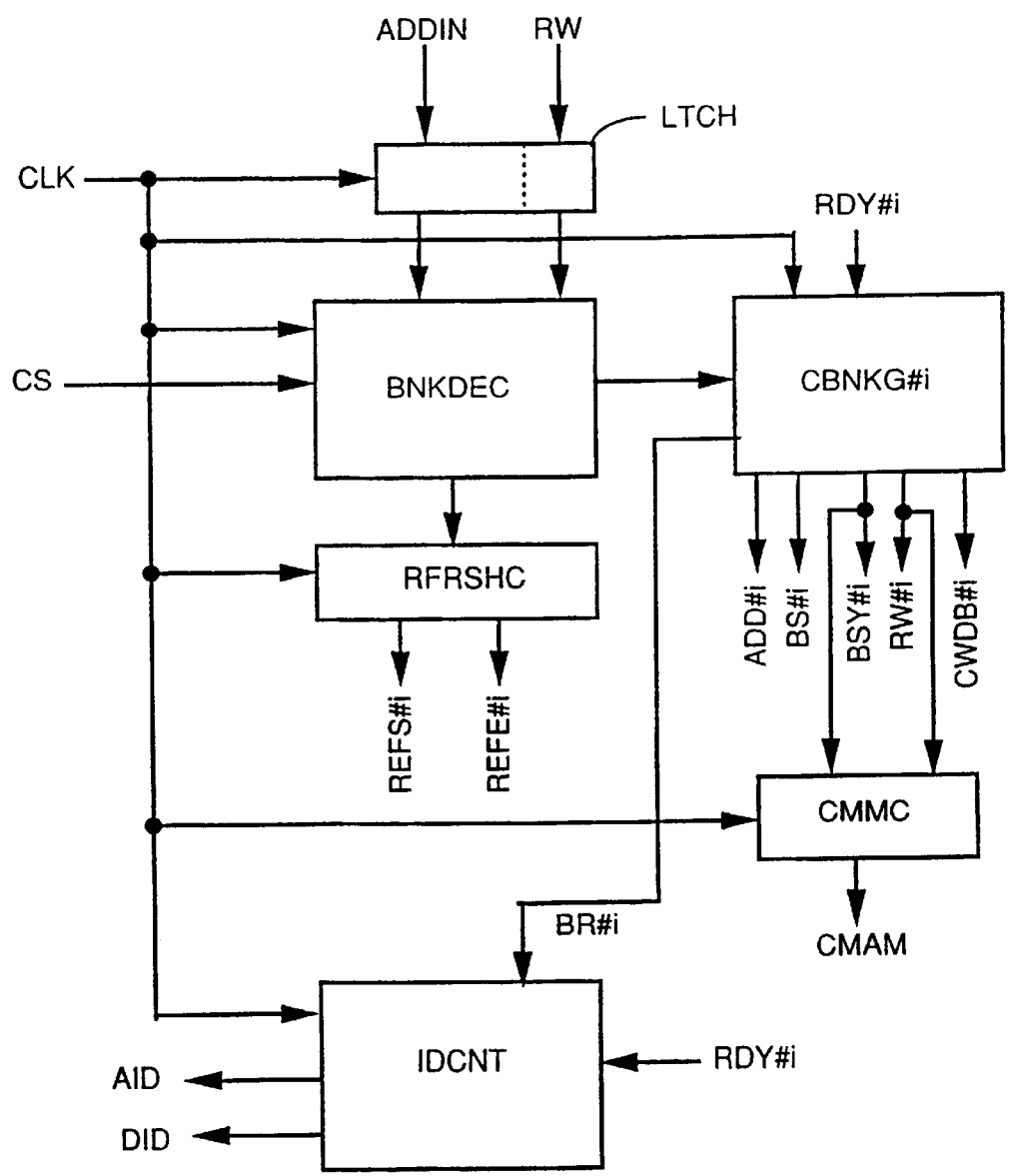
FIG. 24 is a block diagram of the access sequence controller with ID.

FIG. 24 shows a block diagram of the access sequence controller module with ID 17. The access sequence controller module with ID 17 comprises a latching circuit LTCH, a bank decoding circuit BNKDEC, a bank control signal generating circuit CBNKG*i(i=0–3), a refresh controller RFRSHC, a main amplifier control signal generating circuit CMMC, an ID signal controller IDCNT, etc.

The latching circuit LTCH fetches both address signal ADDIN and read/write selection signal RW at the rising edge of the clock signal CLK respectively.

The bank decoding circuit BNKDEC decodes the bank information included in the address signal ADDIN, thereby deciding the memory bank to which an access request is issued.

The bank control signal generating circuit CBNKG#i(i=0–3) outputs the address signal ADD#i(i=0–3) indicating the memory bank to which an access request is issued, as well as the control signal CBANKH (bank selection signal BS#i, RW#i(i=0–3), BSY#i(i=0–3), etc.), the bank request signal BR#i(i=0–3), and the write data buffer control signal CWDB#i(i=0–3). The bank request signal BR#i(i=0–3) is output unconditionally when a memory access request is issued, but the bank selection signal BS#i (i=0–3) is not output until accessing of an object memory bank is enabled.

The refresh controller RFRSHC outputs the refresh request signal REFS#i(i=0–3) and the refresh interruption signal REFE#i(i=0–3) to each memory bank. Receiving the refresh request signal REFS*i(i=0–3), the subject memory bank generates a refresh address in the controller BKCONTH, thereby refreshing itself. If the refresh interruption signal REFE#i(i=0–3) is entered during a refresh operation, the refreshing is paused.

The ID signal controller IDCONT generates both address ID signal AID and data ID signal DID from the bank request signal BR#i(i=0–3) and the ready signal RDY#i(i=0–3). Since data can be entered/output in order of entered address in/from the same memory bank, the memory bank number and the ID number can be corresponded to each other. Consequently, it is possible to judge which of the memory banks is accessed according to the bank request signal BR#i(i=0–3). It is thus possible to generate the address ID signal AID from the bank request signal BR#i(i=0–3). In addition, it is possible to judge which of the memory banks is ready according to the ready signal RDY#i(i=0–3) indicating that the subject memory bank is ready to output/receive data. It is thus possible to generate the data ID signal DID from the ready signal RDY#i(i=0–3).

The main amplifier control signal generating circuit CMMC generates the main amplifier control signal CMAM.

Figure 25:
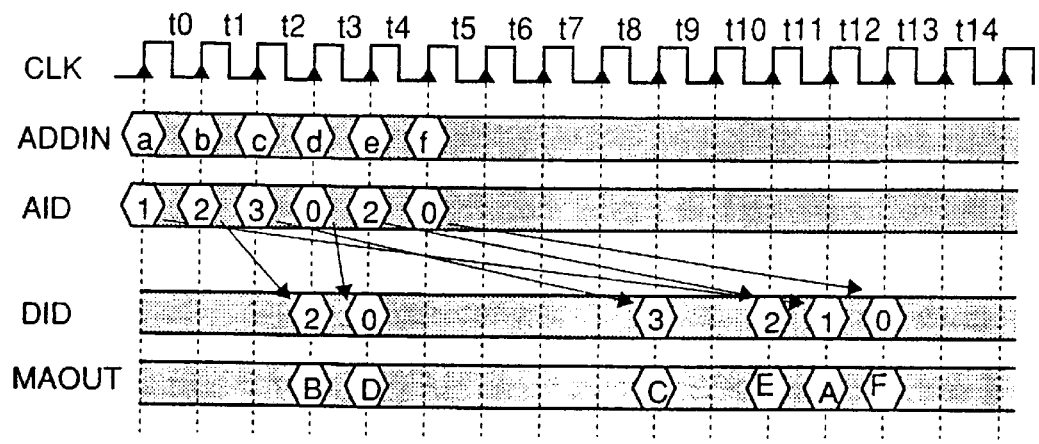
FIG. 25 shows waveforms of the operation of the memory macro in the third example.

FIG. 25 shows a timing chart for the operation of the memory macro MM4 that outputs both data and ID number as described above. At first, four addresses a, b, c, and d (different bank addresses) are entered consecutively to the address signal line ADDIN, then four ID numbers, each corresponding to an entered address, are output as address ID signals AID. Those ID numbers are also output as the data ID signal DID when a read operation is ended and the data is output.

For example, an ID number 1 is assigned to the address a entered firstly. If the address a corresponds to a memory bank being refreshed, however, data A is output together with the data ID signal DID in the period t12. The address b to which an ID number 2 is assigned corresponds to the data already held in the sense amplifier block SA. The data is thus output at the latency value 2. The address c corresponds to the data output by pausing the refreshing temporarily and the address d corresponds to the data existing in the main amplifier MA and to be output from there.

Since this example takes the correspondence between address and data using an ID number respectively such way, it is no need to match the order of address input with the order of data output. This example thus makes it possible to output first-prepared data first, thereby allowing memory banks to be accessed faster.

In addition, the address input timing and the data output timing will be overlapped depending on the address input timing. In such a case, it is considered that the data corresponding to the address entered first is in a higher emergency, so the data is output first. The busy signal BSY#i(i=0–3) is used to control this operation.

For example, the operation is a memory access in which the data is output at a latency value of 7 as shown with "Mishit" in FIG. 22. The data corresponding to the address e is output in the period t11. However, the period t12 in which the data corresponding to the address f should be output is t12, but the data output is overlapped with the data output corresponding to the address a. Consequently, since priority is given to the data corresponding to the address a, which is entered first, the latency value for the data output corresponding to the address f is increased by one. The data is thus output in the period t13.

Figure 26:
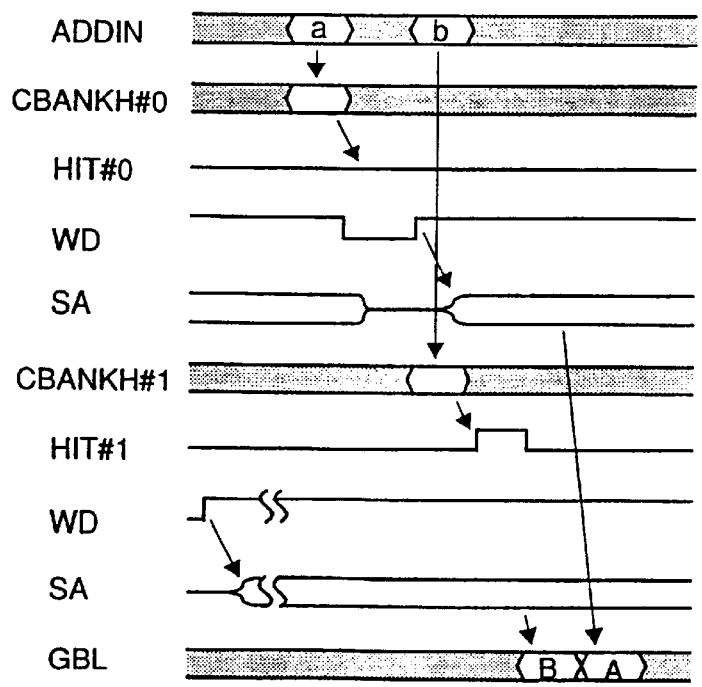
FIG. 26 shows waveforms of the operation of the cache bank module in the third example of the memory macro.

FIG. 26 shows the internal operation of each memory bank. In order to simplify the description, FIG. 26 shows the operations of only two memory banks. At first, two addresses a and b are entered, so that two memory banks BANK#0 and BANK#1 are accessed. Since a cache hit miss occurs in the memory bank BANK#0, the word line WD is deactivated once. The word line WD is activated again after the corresponding sense amplifier is pre-charged. Then, the sense amplifier is actuated.

In the memory bank BANK#1, the cache is hit. So, the signal HIT#1 is output and the data B is output immediately to the global bit line GBL. After this, the operation of the sense amplifier in the memory bank BANK#0 is completed and the data A is read and output to the global bit line GBL.

The write operation is also done just like the above read operation. The address signal ADDIN can be entered in every clock cycle. Consequently, write data is transmitted to the memory macro MM4 in every clock cycle. However, the write data cannot always be written into each memory bank immediately. To avoid such a problem, therefore, the write data is stored in the write data buffer WDB temporarily. The write data is then read from the write data buffer WDB and output to the object memory bank when the memory bank is ready to receive data. The write buffer control signal CWDB#i is used to control the operation. In other words, one of the word lines BWL of the write buffer WB is selected and the write data is written into the word line. After this, when the subject memory bank is ready to receive data, the word line BWL is selected again and the write data is output to the data line 10. Then, the write amplifier enable signal WAE is activated and the write data output to the data line 10 is output to the global bit line GBL by the write amplifier provided in the main amplifier MA#i. At this time, the data ID signal DID is also output.

<<Another Configuration of Access Sequence Controller Module with ID>>

Figure 27:
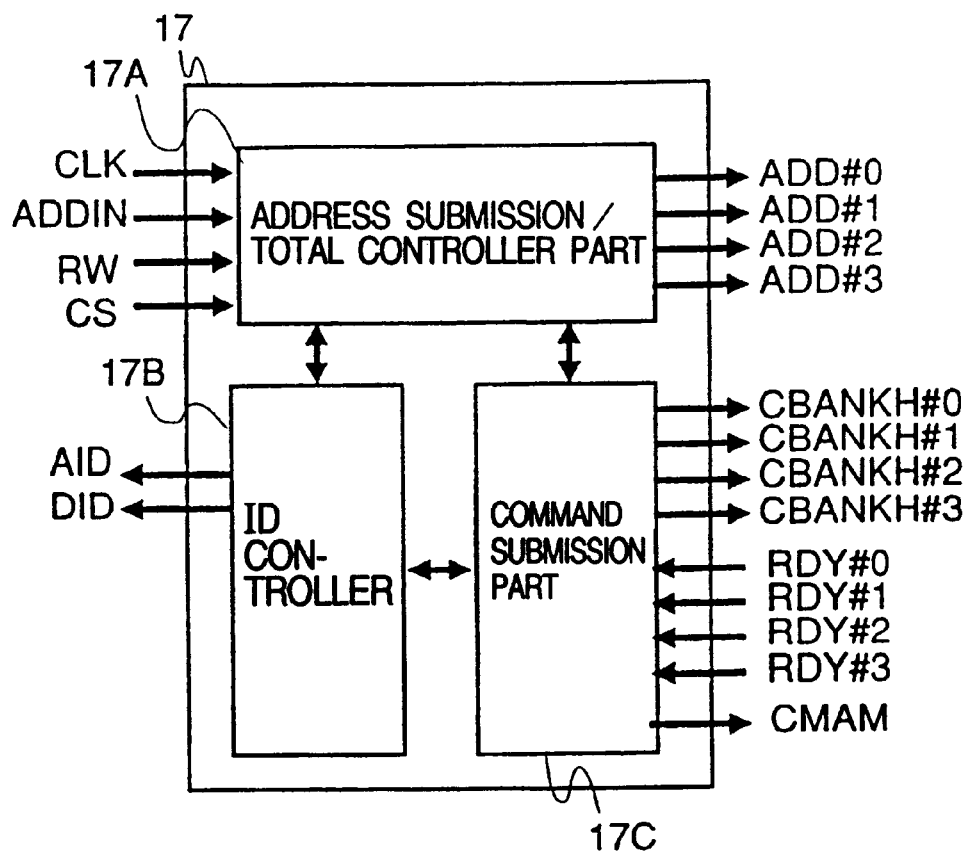
FIG. 27 is a block diagram of the access sequence controller with ID in another example.

FIG. 27 shows another block diagram of the access sequence controller module 17 with ID. This controller 17 comprises an address submission/total control unit 17A, an ID controller 17B, and a command submission part 17C. The address submission/total control unit 17A, when receiving the address signal ADDIN, instructs the ID controller 17B to output the address ID signal AID. The ID controller 17B references to a table (to be described later), thereby outputting an address ID as the address ID signal AID. In addition, the address submission/total control unit 17A requests the command submission part 17C to issue a command to a memory bank corresponding to the entered address. The command submission part 17C, which manages the state of each memory bank, issues instruct a timing for issuing the inputted address to the address submission/total control part 17A and simultaneously outputs a command. The command submission part 17C also outputs the control signal CMAM to instruct the ID controller 17B to output a data ID so as to operate the main amplifier MA by deciding the order for outputting data from each memory bank. The ID control unit 17B references to a table thereby to output an address ID as the data ID signal DID. The address ID is issued for the address of the object data.

Figure 28:
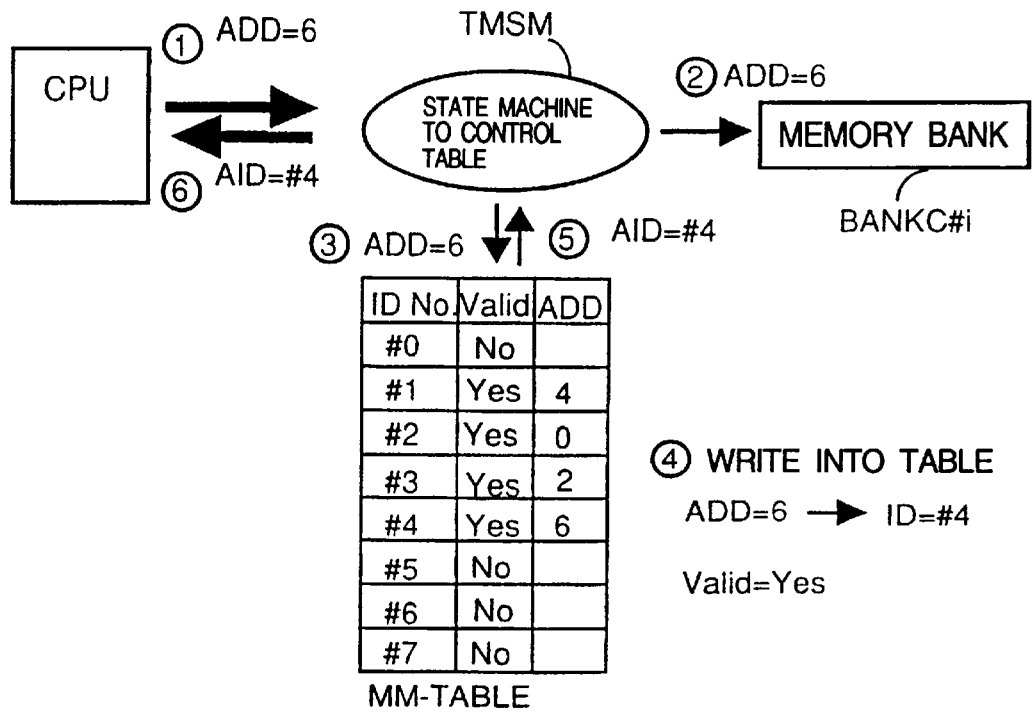
FIG. 28 is a flowchart for issuing the address ID signal AID when the address signal ADDIN is entered.
Figure 29:
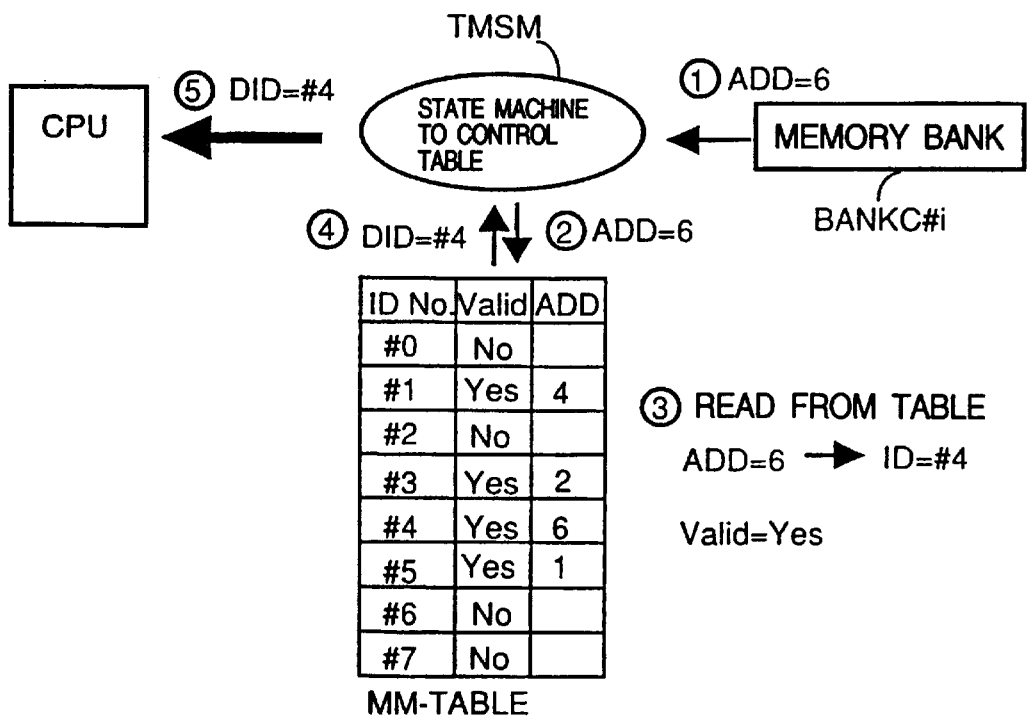
FIG. 29 is a flowchart for issuing the data ID signal DID when data is output.

FIGS. 28 and 29 show control flowcharts of the ID control unit 17B. A table MM-TABLE is used to hold the information (Valid: hereafter, to be referred to as an effective flag VALID) indicating that the ID number. (ID No.), the address value (ADD), and the correspondence between them are all valid. Data is written/referenced into/to this table MM-TABLE. A table management state machine TMSM controls those write and reference operations. FIGS. 28 and 29 show diagrammatic views of the information flow among the central information unit (CPU), the memory bank BANKC#i, and the table MM-TABLE.

FIG. 28 shows a flowchart for issuing the address ID signal AID when the address signal ADD is entered. The address signal ADDIN (hereafter, to be represented as the address signal ADD) entered from the central processing unit (CPU) is output as the address signal ADD to the object memory bank BANKC#i. An ID number corresponding to the address signal ADD is thus decided. This ID number is returned as the address ID signal AID to the CPU. Hereafter, the operation flow shown in FIG. 28 will become as follows in a concrete example.

(1) The CPU transmits the address signal ADD(ADD=6) to the address submission/total control unit 17A.
(2) The address submission/total control unit 17A outputs the address signal ADD(ADD=6) to the object memory bank BANKC#i.
(3) The address submission/total control unit 17A transmits the address signal ADD(ADD=6) to the table MM-TABLE.
(4) The address signal ADD(ADD=6) is written into a place of the table MM-TABLE, corresponding to the ID number (ID=#4), thereby the valid flag VALID is validated ("Yes" is shown in FIG. 28).
(5) The address ID signal AID(AID=#4) assigned from the table MM-TABLE is read.
(6) The assigned address ID signal AID(AID=#4) is returned to the CPU.

The CPU holds the value of the address ID signal AID (AID=#4) so as to know the correspondence between address and data by detecting matching of the value of the AID with the data ID signal DID added when object data is output.

FIG. 29 shows a flowchart for issuing the data ID signal DID when data is output. A signal indicating the data output from the memory bank BANKC#i is entered, then the address signal ADD with which the memory bank has been accessed is decoded. The ID number corresponding to the address signal ADD is checked. This ID number is returned to the CPU as the data ID signal DID. Hereafter, the operation flow shown in FIG. 29 will become as follows in. a concrete example.

(1) The ready signal RDY#i is returned from the memory bank BANKC#i that outputs data to the command submission part 17C, thereby the address signal ADD (ADD= 6) is obtained from the address latching circuit ADDLT#i that latches an access address in the address submission/ total control unit 17A.
(2) The address signal ADD(ADD=6) is entered to the table MM-TABLE.
(3) The ID number corresponding to the address signal ADD(ADD=6) is searched in the table MM-TABLE.
(4) The data ID signal DID(DID=#4) is read from the table MM-TABLE.
(5) The data ID signal DID(DID=#4) is output to the CPU.

Receiving data and the data ID signal DID(DID=#4), the CPU can know that this data corresponds to the address signal ADDIN(ADDIN=6) from the value of the address ID signal AID(AID=#4) received previously.

The contents in the table MM-TABLE shown in FIG. 28 differ from the contents in the table MM-TABLE shown in FIG. 29. In the table MM-TABLE shown in FIG. 29, the valid flag VALID corresponding to ID No.#2 is invalidated ("No" is shown in FIG. 29) and the address space ADD is thus blank. This indicates that the data corresponding to the address value 2 is already read out and #2 is transmitted to the CPU as the value of the data ID signal DID. If the valid flag VALID is invalidated, a new address can be entered. In the table MM-TABLE shown in FIG. 29, the valid flag VALID corresponding to ID No.#5 is validated and 1 is written in the address ADD. The difference between the above two cases indicates that the data corresponding to the value 0 of the address ADD is read out between when 6 is entered to an object memory macro as the value of the address ADD and when the data is output, then 1 is entered as the value of the address ADD.

Figure 30:
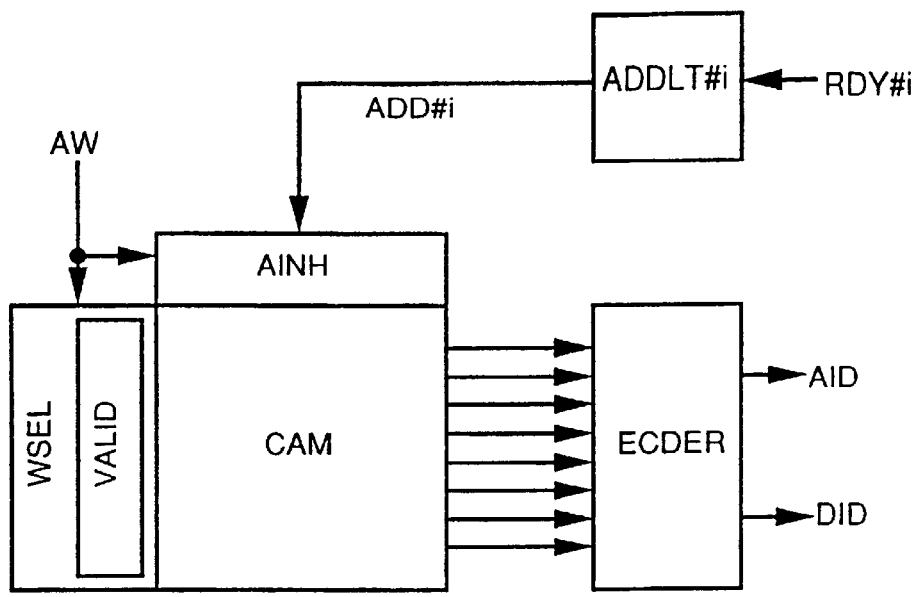
FIG. 30 is a block diagram of a table MM-TABLE.

FIG. 30 shows a block diagram of the table MM-TABLE. The table MM-TABLE comprises an associative memory CAM, etc. For example, if the control signal AW is set to the "HIGH" level, an association stopping circuit AINH stops association and an association memory word line selection circuit WSEL is actuated, thereby a word line for which the valid flag is invalidated is selected. In this state, the address ADD is entered to the associative memory CAM and held in it. If an ID number is corresponded to the word line of the associative memory CAM beforehand, the selected word line is encoded by the encoding circuit ENDER, thereby the address ID signal AID is obtained. If the control signal AW is set to the "LOW level, the association stopping circuit AINH starts association, thereby the operation of the association memory word line selection circuit WSEL stops. If the address ADD is entered to the associative memory CAM in this state, an association operation is started and the matching line of the row storing the corresponding address is set to the "HIGH" level. If an ID number is corresponded to the matching line of the associative memory CAM beforehand, the selected matching line is encoded by the encoding circuit ENDER, thereby the data ID signal DID is obtained. In addition, if the valid flag VALID is reset on the matching line of the associative memory CAM, the ID number corresponding to the access-ended address can be invalidated.

The ID number can be used such way to change the order of both address input and data output to/from a memory macro. Consequently, the data prepared first can be output first, thereby it is possible to compose a memory macro provided with a very effective cache function easily.

<<Application to a Multiprocessor System>>

Figure 31:
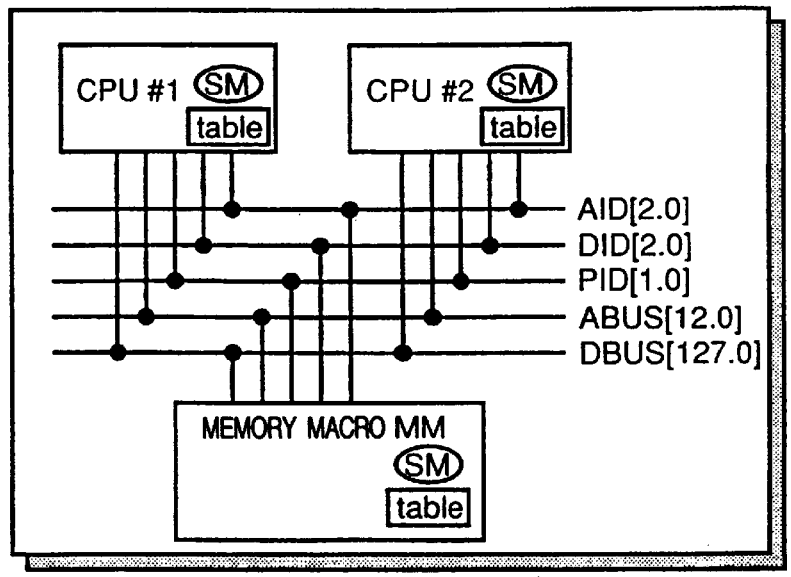
FIG. 31 is a block diagram of a multi-processor system.

The method that uses ID numbers as described above can also apply to a multiprocessor system. FIG. 31 shows a block diagram of such a multiprocessor system. In this example, two processors (CPU#1 and CPU#2) share one memory macro MM. This multiprocessor also includes an address bus ABUS, a data bus DBUS, an address ID signal line, a data ID signal line DID, and a processor ID signal line PID that indicates a processor number. Each processor outputs the processor ID signal PID, which notifies the memory macro MM of which of the processors has issued an address when the address is issued. The memory macro MM manages the value of the processor ID signal PID together with the address value, so that the processor ID signal PID is output again when data is output, thereby identifying the object processor to which the data is to be transmitted.

Figure 32:
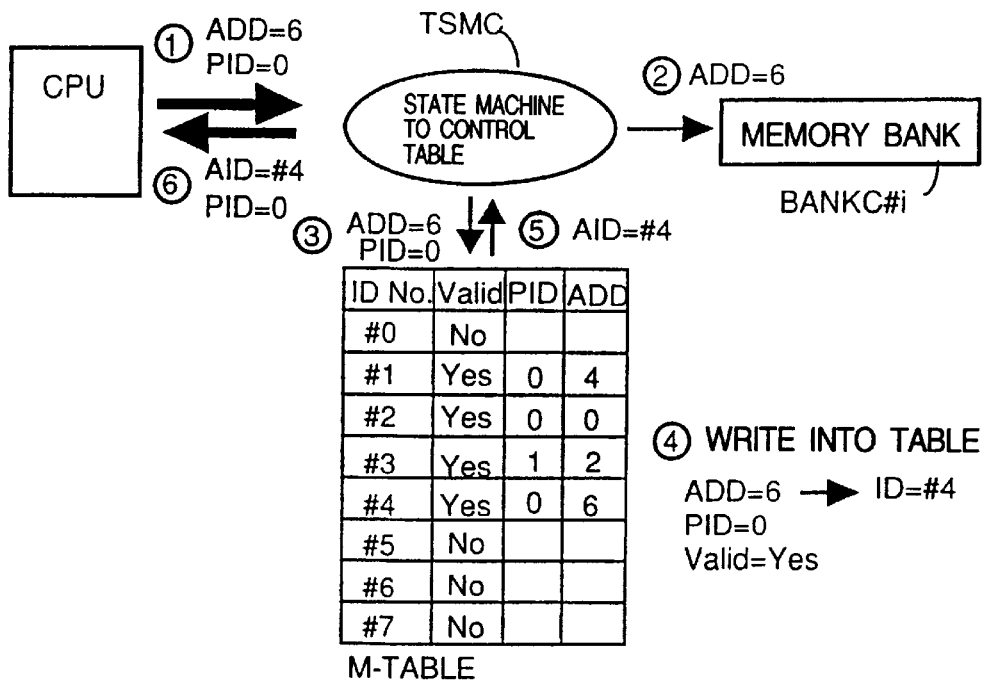
FIG. 32 is a flowchart for issuing the address ID signal AID when the address signal ADDIN is entered.

FIG. 32 shows a flowchart for issuing the address ID signal AID and the processor ID signal PID from the memory macro MM when an address is entered. This flowchart is the same as that shown in FIG. 28 except for the management of the processor ID signal PID added to the table this time. Hereafter, the operation flow shown in FIG. 32 will become as follows in a concrete example.

(1) Both address signal ADD (ADD=6) and processor ID signal PID(PID=0) are entered to the address submission/total control unit 17A from the CPU.

(2) The address submission/total control unit 17A outputs the address signal ADD(ADD=6) to the object memory bank BANKC#i.
(3) The address submission/total control unit 17A enters both address signal ADD(ADD=6) and processor ID signal PID(PID=0) to the table M-TABLE.
(4) Both address signal ADD (ADD=6) and processor ID signal PID(PID=0) are written into places in the table M-TABLE, corresponding to the ID number (ID=#4), then the valid flag VALID is validated ("Yes" is shown in FIG. 32).
(5) The address ID signal AID(AID=#4) assigned from the table M-TABLE is read out.
(6) Both read-out address ID signal AID(AID=#4) and processor ID signal PID(PID=0) are returned to the CPU.

Figure 33:
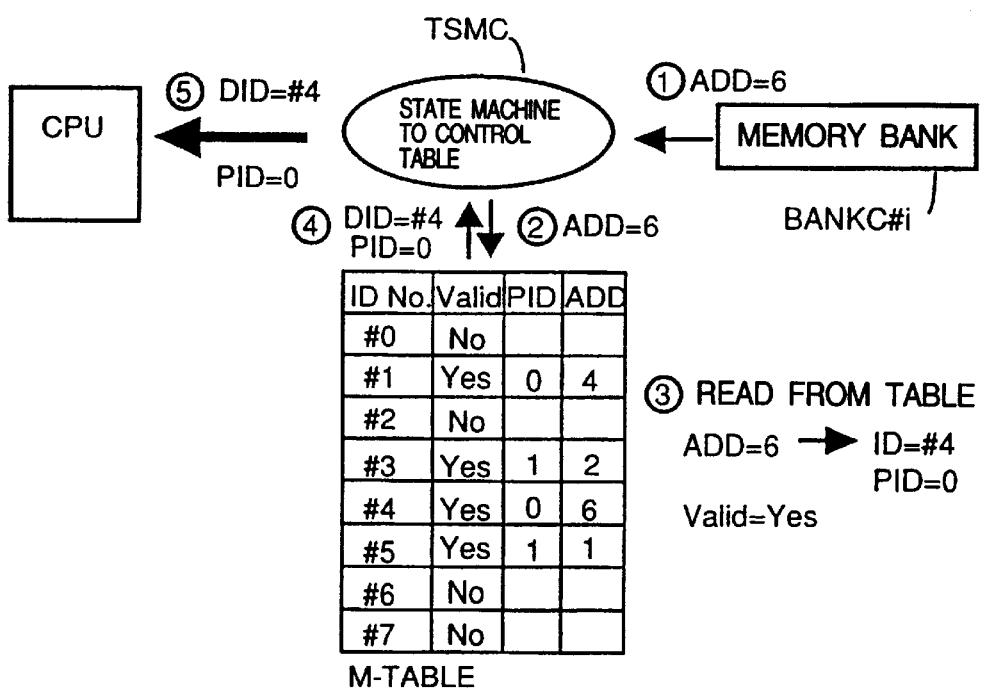
FIG. 33 is a flowchart for issuing the data ID signal DID when data is output.
Figure 34:
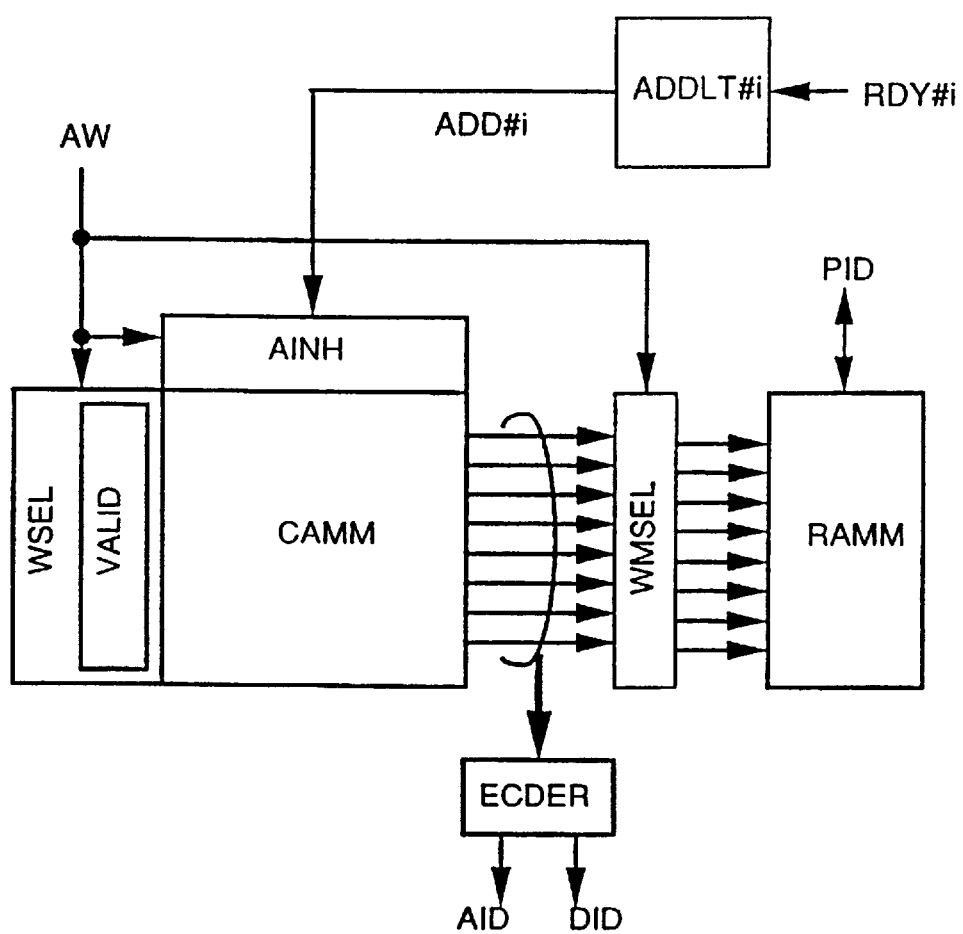
FIG. 34 is a block diagram of a table M-TABLE.

FIG. 33 shows a flowchart for issuing both data ID signal DID and processor ID signal PID when data is output. This flowchart is the same as that shown in FIG. 29 except for the management of the processor ID signal PID added to the table this time. Hereafter, the above operation flow shown in FIG. 33 will become as follows in a concrete example.

(1) The ready signal RDY#i is returned from the memory bank BANKC#i that outputs data to the command submission part 17C, thereby the address signal ADD (ADD= 6) is obtained from the address latching circuit ADDLT#i used to latch an access address in the address submission/total control unit 17A.
(2) The address signal ADD(ADD=6) is entered to the table M-TABLE.
(3) The ID number (ID=#4) corresponding to the address signal ADD (ADD=6) and the processor ID signal PID (PID=O) are searched in the table M-TABLE.
(4) The data ID signal DID(DID=#4) and the processor IS signal PID(PID=0) are read out from the table M-TABLE.
(5) The data ID signal DID(DID=#4) and the processor IS signal PID(PID=0) are output to the CPU.

FIG. 39 shows a block diagram of the table M-TABLE. The table M-TABLE comprises an associative memory CAMM, a random access memory RAMM, etc. For example, if the control signal AW is set to the "HIGH" level, the association stopping circuit AINH stops association and the association memory word line selection circuit WSEL is actuated, thereby a word line for which the valid flag is invalidated is selected. The control signal AW allows the matching line/word line selection circuit WMSEL of the associative memory CAMM to select a word line and connect the word line to the word line of the random access memory RAMM. The address signal ADD is entered to the associative memory CAMM and stored there in this state. The processor ID signal PID is entered to the random access memory RAMM and stored there. If an ID number is corresponded to the word line of the associative memory CAMM beforehand, the selected word line can be encoded by the encoding circuit ENDER, thereby obtaining the address ID signal AID. If the control signal AW is set to the "LOW" level, the association stopping circuit starts association and the associative memory word line selection circuit WSEL stops its operation. The control signal AW allows the matching line/word line selection circuit WMSEL of the associative memory CAMM to select a matching line and connects the matching line to the word line of the random access memory RAMM. If the address signal ADD is entered to the associative memory in this state, an association operation is started and the matching line of the row storing the object address is set to the "HIGH" level. Consequently, the processor ID(PID) is read from the random access memory RAMM. If an ID number is corresponded to the matching line of the associative memory CAMM beforehand, the selected matching line can be encoded by the encoding circuit ENDER, thereby obtaining the data ID signal DID. If the valid flag VALID is reset on the matching line of the associative memory CAMM, the ID number corresponding to the access-ended address can be invalidated.

Figure 35:
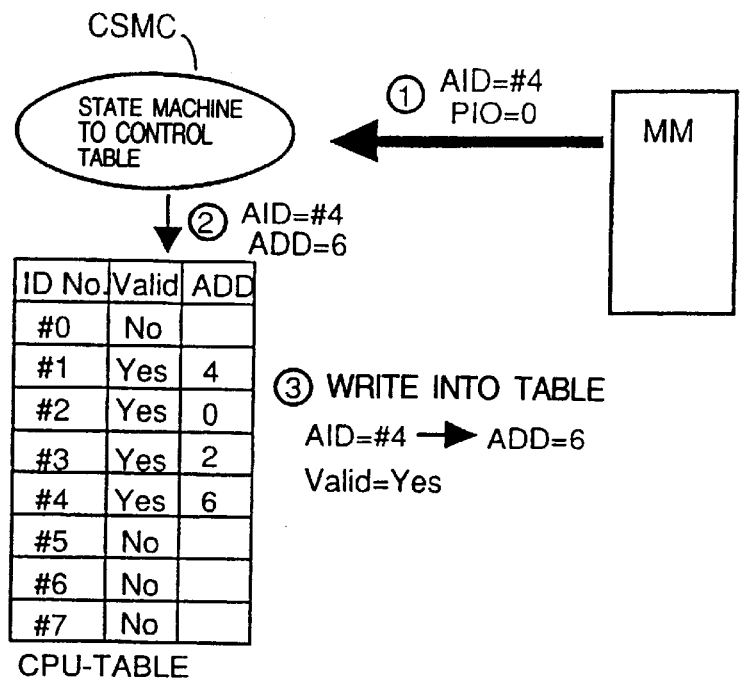
FIG. 35 is a flowchart for controlling the processor using the address ID signal.
Figure 36:
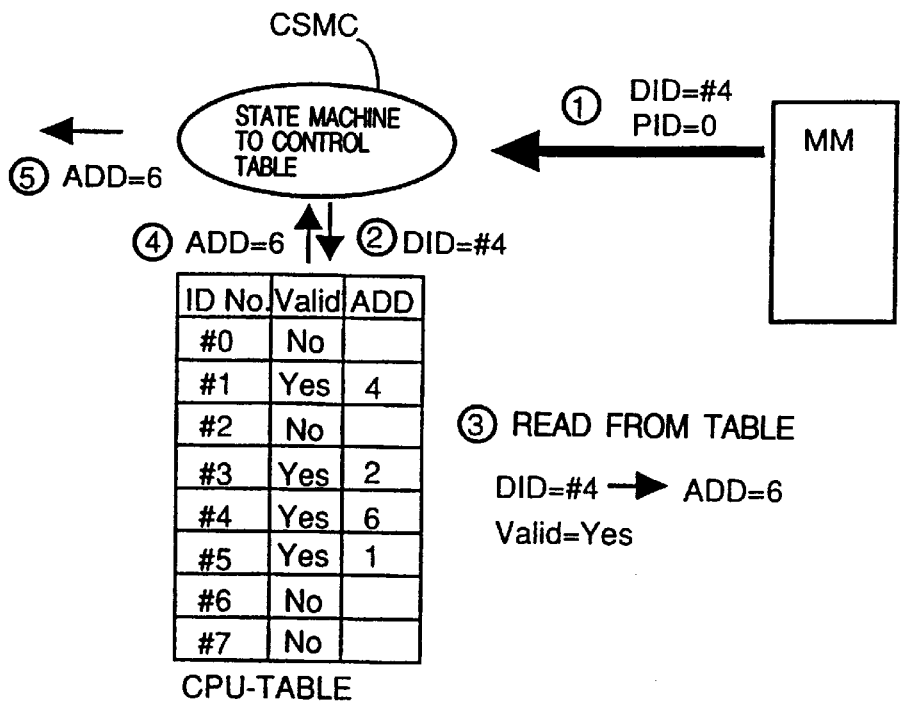
FIG. 36 is a flowchart for controlling the processor using the data ID signal.

FIGS. 35 and 36 shows flowcharts for managing ID numbers in a processor. FIG. 35 shows a flowchart for reading the address ID signal AID. The CPU is also provided with a table CPU-TABLE that describes the correspondence between ID numbers and addresses just like the memory macro MM. The table management state machine CSMC references to the table CPU-TABLE thereby to indicate the correspondence between an ID number and an address. Hereafter, the operation flow shown in FIG. 35 will become as follows in a concrete example.
(1) Both address ID signal AID(AID=#4) and processor ID signal PID(PID=0) are entered from the memory macro MM.
(2) If the processor ID signal PID(PID=0) indicates the ID of its own processor, the address signal ADD (ADD=6) and the address ID signal AID(AID=#4) are entered to the table CPU-TABLE.
(3) The address signal ADD (ADD=6) and the address ID signal AID (AID=#4) are written into places in the table CPU-TABLE, corresponding to the ID number(ID=#4), thereby the valid flag VALID is validated ("Yes" is shown in FIG. 35).

FIG. 36 shows a flowchart for reading the data ID signal DID. Hereafter, the operation flow shown in FIG. 36 will become as follows in a concrete example.
(1) Both data ID signal DID(DID=#4) and processor ID signal PID(PID=0) are entered to the memory macro MM.
(2) If the processor ID signal PID(PID=0) indicates the ID of its own processor, the data ID signal DID(DID=#4) is entered to the table CPU-TABLE.
(3) The address signal ADD (ADD=6) corresponding to the data ID signal DIF(DID=#4) is searched in the table CPU-TABLE.
(4) The address signal ADD(ADD=6) is read from the table CPU-TABLE.
(5) The address signal ADD(ADD=6) is output.

Figure 37:
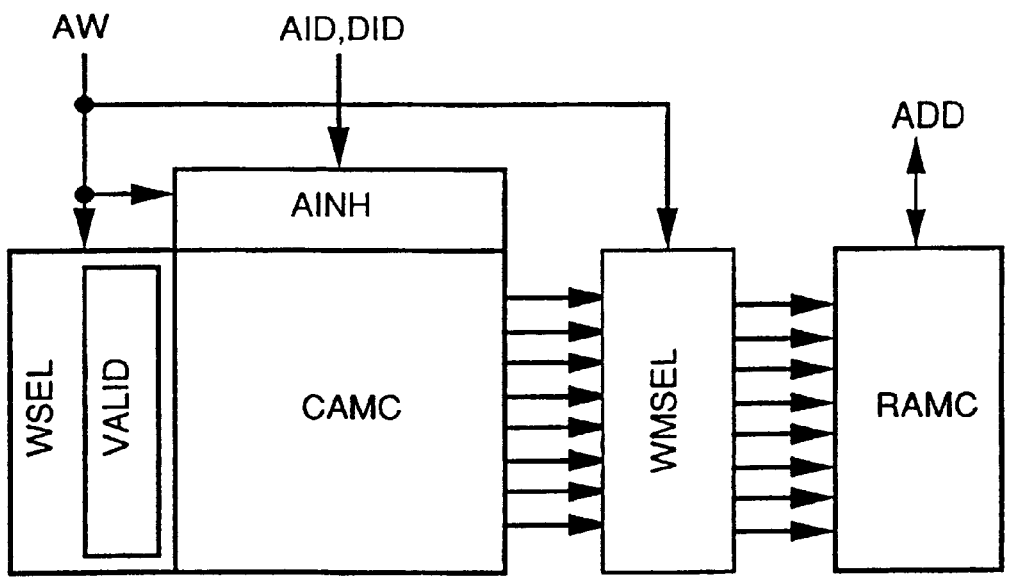
FIG. 37 is a block diagram of a table CPU-TABLE.

FIG. 37 shows a block diagram of the table CPU-TABLE. The table CPU-TABLE comprises an associative memory CAMC, a random access memory RAMC, etc. For example, if the control signal AW is set to the "HIGH" level, the association stopping circuit AINH stops association and the association memory word line selection circuit WSEL is actuated, thereby a word line for which the valid flag is invalidated is selected. In addition, the control signal AW allows the matching line/word line selection circuit WMSEL of the associative memory CAMC to select a word line and connects the word line to a word line of the random access memory RAMC. The address ID signal AID is entered to the associative memory CAMC in this state and stored there. The address ADD is entered to the random access memory RAMC and stored there. If the control signal AW is set to the "LOW level, the association stopping circuit AINH starts association and the association memory word line selection circuit WSEL stops its operation. In addition, the control signal AW allows the matching line/word line selection circuit WMSEL of the associative memory CAMC to select a matching line and connects the matching line to a word line of the random access memory RAMC. If the data ID signal DID is entered to the associative memory CAMC in this state, an association operation is started and the matching line of the column in which the object ID number is stored is set to the "HIGH" level. Consequently, the address ADp is read from the random access memory RAMC. The ID number corresponding to the access-ended address can be invalidated by resetting the valid flag VALID on the matching line of the associative memory CAMC.

Since the order to enter addresses and the order to output data to/from a memory macro can be changed using ID numbers such way, the data prepared first can be output first. It is thus possible to compose a memory macro provided with an effective cache function easily. In addition, the application of such a memory macro will make it possible to compose a shared memory system using multiprocessor.

The present invention having been described concretely with reference to some examples is not limited to those examples; it may be modified freely as long as the concept of the present invention is not overstepped.

Some representative effects of the invention disclosed in this application will be described below briefly.

Concretely, memory macros are stored in a data base as function modules such as memory banks, main amplifiers, power supplies, controllers, etc. Such a memory macro provided with various functions or a variable memory capacity can be composed easily only by combining and disposing those function modules.

Controller functions are provided in each memory bank composing a memory macro or in a controller for controlling the memory bank, although those functions are provided in or outside a large logic circuit such as a microprocessor and an image processor conventionally. It is thus easy for the present invention to design a large logic circuit such as a microprocessor and an image processor.

Furthermore, a plurality of memory banks can be accessed continuously and the data prepared first can be output first, so it is possible to reduce page miss and refresh penalty errors.

What is claimed is:

1. A semiconductor integrated circuit device having a memory and a data bus for coupling with a CPU on a semiconductor substrate, said memory comprising:

a memory cell array;

a sense amplifier block connected to said memory cell array;

a row decoder connected to said memory cell array;

a column decoded connected to said sense amplifier block; and a controller for controlling said memory cell array, said row decoder, said column decoder, and said sense amplifier block, wherein said controller holds an address in a memory cycle after another address is entered in the next memory cycle, wherein said controller compares an address in a memory cycle with another address in the next memory cycle and makes the data held in said sense amplifier block output to an outside of said memory without reading data from said memory array when both addresses match as a result of said comparison, and wherein said controller further outputs a signal, which indicates readiness for data outputting to said data bus and data writing to said memory via said data bus, to said CPU.

2. A semiconductor integrated circuit device having a plurality of memory banks on a semiconductor substrate, each of said plurality of memory banks comprising:

a memory cell array;

a plurality of bit lines connected to said memory cell array;

a sense amplifier block connected to said memory cell array;

a row decoder connected to said memory cell array;

a column decoder connected to said sense amplifier block; and a controller for controlling said memory cell array, said row decoder, said column decoder, and said sense amplifier block, wherein said controller holds an address in a memory cycle after another address is entered in the next memory cycle, wherein said controller includes a comparator and the comparator compares an address in a memory cycle with another address in the next memory cycle, wherein said plurality of bit lines of said plurality of memory banks are commonly coupled by a plurality of global bit lines;

wherein said controller further includes an output circuit and said output circuit outputs a first signal which indicates readiness for data outputting to said plurality of global bit lines from a corresponding one of said plurality of memory banks and data writing to the corresponding one of said plurality of memory banks via said plurality of global bit lines.

3. The semiconductor integrated circuit device according to claim 2, wherein said controller makes the data held in said sense amplifier block output to an outside of the corresponding one of said plurality of memory banks without reading data from said memory cell array when a read operation is started for one of said plurality of memory banks and both addresses compared in said comparator are equal.

4. The semiconductor integrated circuit device according to claim 2, wherein said controller makes data read from said memory cell array when a read operation is started for one of said plurality of memory banks and both addresses compared in said comparator aren't equal.

5. The semiconductor integrated circuit device according to claim 2, further comprising a plurality of read amplifiers and a plurality of write amplifiers, both read amplifiers and write amplifiers connected to said plurality of global bit lines.

6. The semiconductor integrated circuit device according to claim 5, further comprising a control unit and said control unit generates second signal to be issued to each of said plurality of memory banks according to said first signal issued from each of said plurality of memory banks.

7. The semiconductor integrated circuit device according to claim 6, wherein each of said plurality of memory banks outputs data to said plurality of global bit lines according to said second signal in a read operation.

8. The semiconductor integrated circuit device according to claim 7, wherein aid control unit generates third signal for selecting one of said plurality of memory banks.

9. A semiconductor integrated circuit device on a semiconductor substrate, comprising:

a first memory and a second memory, each having a memory cell array, a sense amplifier block connected to said memory cell array, a row decoder connected to said memory cell array, a column decoder connected to said sense amplifier block, and a controller for controlling said memory cell array, said row decoder, said column decoder, and said sense amplifier block; and a control unit connected to said first and second memories, wherein said control unit can read data from said first or second memory regardless of the order of memory accesses.

10. A semiconductor integrated circuit device according to claim 9, wherein said control unit outputs an identification information corresponding to an input address when the input address is inputted and outputs said identification information when an information is read out according to the input address.

11. A semiconductor integrated circuit device according to claim 9, wherein said controller compares a newly entered address with an address corresponding to an information held in said sense amplifier block through a past memory access and outputs the information held in said sense amplifier block without reading information from said memory cell array when both addresses match as a result of said comparison.

12. A semiconductor integrated circuit device according to claim 11, wherein said controller can notify the address matching to an outside of said memory.

13. A semiconductor integrated circuit device according to claim 9, further comprising:

a common bit line that can be connected to the sense amplifier block of said first memory and the sense amplifier block of said second memory; and a first circuit including an amplifier for amplifying the signal from said sense amplifier through said common bit line and a circuit for transmitting a signal to said sense amplifier block through said common bit line.

14. A semiconductor integrated circuit device according to claim 13, further comprising a second circuit including a circuit for generating a voltage used for said first and second memories and said first circuit.

15. A semiconductor integrated circuit device according to claim 14, wherein said semiconductor integrated circuit device can change the capacity of memory by changing the number of said first or second memory connected to said first or second circuit.

16. A semiconductor integrated circuit device according to claim 9, further comprising an arithmetic circuit.

17. A semiconductor integrated circuit device according to claim 9, wherein said memory cell array comprises DRAM memory cells.

18. A semiconductor integrated circuit device having a plurality of memories on a semiconductor substrate, each of said plurality of memories comprising:

a memory cell array;

a sense amplifier block connected to said memory cell array;

a row decoder connected to said memory cell array;

a column decoder connected to said sense amplifier block; and a controller for controlling said memory cell array, said row decoder, said column decoder, and said sense amplifier block, wherein said semiconductor integrated circuit device further comprises a common bit line connected to said plurality of memories and a read amplifier connected to said common bit line, and wherein said controller holds both X address and Y address in a memory cycle after an address of the next memory cycle are entered.

19. A semiconductor integrated circuit device according to claim 18, wherein said controller includes a comparator and said comparator compares both X and Y addresses in a memory cycle with both X and Y addresses in the next memory cycle.

20. A semiconductor integrated circuit device according to claim 19, wherein when a read operation for one of said plurality of memories are started, said controller makes the data stored in said sense amplifier block output to an outside of said memory without reading data from said memory array when X addresses compared in said comparator match, said controller makes the data stored in said sense amplifier block output to an outside of said memory without reading data from said memory array when both X and Y addresses in said comparator match, and said controller makes data read from said memory cell array when X and Y addresses in both memory cycles do not match.

21. A semiconductor integrated circuit device on a semiconductor substrate, comprising:

a first memory and a second memory, each including a memory cell array; a sense amplifier block connected to said memory cell array; a row decoder connected to said memory cell array; a column decoder connected to said sense amplifier block; and a control circuit for controlling said memory cell array, said row decoder, said column decoder, and said sense amplifier block;

a control unit connected to said first and second memories; and a processor connected to said control unit, wherein said control unit can output data to said processor in an order which is different from an order of memory accesses by said processor.

22. A semiconductor integrated circuit device on a semiconductor substrate, comprising:

a first memory and a second memory, each including a memory cell array; a sense amplifier block connected to said memory cell array; a row decoder connected to said memory cell array; a column decoder connected to said sense amplifier block; and a control circuit for controlling said memory cell array, said row decoder, said column decoder, and said sense amplifier block;

a control unit connected to said first and second memories; and a processor connected to said control unit, wherein said control unit outputs an identification information to said processor according to an input address when the input address is inputted, wherein said processor holds said identification information associating with issued address, wherein said control unit outputs said identification information together with the read information according to said entered address to said processor, and wherein said processor detects a matching between an identification information received together with the information according to an address and an identification information held therein.

* * * * *